United States Patent [19]

Snow et al.

[11] Patent Number: 4,876,167

[45] Date of Patent: Oct. 24, 1989

[54] COLOR FILTER ARRAY CONTAINING A PHOTOCROSSLINKED POLYMERIC MORDANT

[75] Inventors: Robert A. Snow, Pittsford; Hugh G. McGuckin, Rochester; Ignazio S. Ponticello, Pittsford; Robert C. Daly, Rochester; Laurel J. Pace, Rochester; Sandra K. Fischer, Rochester; Michael J. Hanrahan, Rochester, all of N.Y.

[73] Assignee: Eastman Kodak Company, Rochester, N.Y.

[21] Appl. No.: 87,486

[22] Filed: Aug. 20, 1987

[51] Int. Cl.$^4$ ............................ G03C 7/12; G03C 1/71
[52] U.S. Cl. ........................................ 430/7; 430/287; 430/321; 430/518; 430/941; 357/30
[58] Field of Search .................. 430/7, 287, 518, 321; 340/703; 357/30

[56] References Cited

U.S. PATENT DOCUMENTS

| | | | |
|---|---|---|---|
| 1,003,720 | 9/1911 | Dufay | 430/7 |
| 1,191,034 | 7/1916 | Rheinberg et al. | 430/206 |
| 3,958,995 | 5/1976 | Campbell et al. | 96/84 |
| 4,065,430 | 12/1977 | Satomura | 430/287 |
| 4,204,866 | 5/1980 | Horak et al. | 430/518 |
| 4,286,049 | 8/1981 | Imamura et al. | 430/287 |
| 4,294,900 | 10/1981 | Aono | 430/7 |
| 4,297,470 | 10/1981 | Osada et al. | 430/287 |
| 4,315,978 | 2/1982 | Hartman | 430/4 |
| 4,353,972 | 10/1982 | Helling et al. | 430/213 |
| 4,387,146 | 6/1983 | Whitmore | 430/7 |
| 4,764,670 | 8/1988 | Pace et al. | 250/226 |

FOREIGN PATENT DOCUMENTS 30476 10/1983 European Pat. Off. .
1594961 8/1981 United Kingdom .

OTHER PUBLICATIONS

Research Disclosure, vol. 151, Nov. 1976, Item 15162.
Sanada et al., "New Deep UV Dyeable Negative Resist for CCD Micro Color Filter", SPIE, vol. 631, Advances in Resist Technology and Processing III (1986), pp. 187–191.
Toshiba Kokai 79246/1984, based on Japanese Application No. 189,081/1982, filed Oct. 29, 1982.

Primary Examiner—Paul R. Michl
Assistant Examiner—Mark R. Buscher
Attorney, Agent, or Firm—Carl O. Thomas

[57] ABSTRACT

A color filter array is disclosed containing interlaid sets of laterally displaced filters comprised of a polymeric matrix and at least one dye. At least one of the sets of filters is comprised of an anionic dye and a cationic polymeric mordant having crosslinking repeating units containing two quaternary ammonium mordanting moieties and a photogenerated ethylenic crosslinking moiety.

16 Claims, 3 Drawing Sheets

COLOR FILTER ARRAY CONTAINING A PHOTOCROSSLINKED POLYMERIC MORDANT

FIELD OF THE INVENTION

The invention relates to color filter arrays, visual display units including color filter arrays, and sensors including color filter arrays.

BACKGROUND OF THE INVENTION

Color filter arrays employed in combination with sensors to define color images or in combination with display devices to permit color images to be viewed are well known. In one illustrative system dating from the turn of the century additive primary multicolor images are formed using a panchromatically sensitized silver halide emulsion layer exposed and viewed through an array of additive primary filters. Exposure through the filter array allows silver halide to be selectively developed either in exposed or unexposed areas. A multicolor image can be viewed by projection through the developed silver and color filter array. Dufay U.S. Pat. No. 1,003,720 and Rheinberg U.S. Pat. No. 1,191,034 illustrate early versions of this filter array application. A more recently developed system of this type is illustrated by Whitmore U.S. Pat. No. 4,387,146.

Color filter arrays comprised of interlaid patterns of additive primary filters have also been employed in connection with electronic image sensors. Forming color filter arrays useful with semiconductor sensors has proven particularly challenging because of the small individual sensor areas, commonly less than $1 \times 10^{-8}$ m² in area, with areas of less than $1 \times 10^{-10}$ m² often being sought. Hartman U.S. Pat. No. 4,315,978 and Sasano et al European Pat. No. 30,476 are considered representative.

A common approach that has been taken in forming color filter arrays is to blend a conventional mordant of the type used in image transfer photography with a negative-working photoresist. Imagewise exposure of the photoresist followed by development leaves hardened photoresist and occluded mordant in exposed areas. Following development dye is imbibed into the filter elements defined by the hardened photoresist.

A discussion of image dye mordanting in image transfer photography is provided in *Research Disclosure*, Vol. 151, November 1976, Item 15162. *Research Disclosure* is published by Kenneth Mason Publications, Ltd., Emsworth, Hampshire P010 7DD, England. Campbell et al U.S. Pat. No. 3,958,995 illustrates a crosslinked mordant useful in diffusion transfer photography. Wagner et al U.K. Pat. No. 1,594,961 discloses avoiding gelatin hardening by providing hardening sites in the mordant. Helling U.S. Pat. No. 4,353,972 discloses mordants which reduce dye wandering in image transfer photography by reacting with latex polymer particles.

While the above-described approach to mordant patterning has proven workable, the filters produced have exhibited limitations, as might be expected. The mordants themselves, being in many instances borrowed from image transfer photography, have no imaging capability. The photoresists, developed primarily for use as protective, usually transient layers in semiconductor fabrication, have exhibited a variety of limitations, including significant optical density (both as initially coated and on aging) and limited solution stability. Further, the combination of both mordant and photoresist molecules in a single layer can mitigate against achieving thinner layers of satisfactory dye imparted optical densities.

Toshiba Kokai 79246/1984, based on application Ser. No. 189,081/1982, filed Oct. 29, 1982, discloses a resist composition for forming color filter elements containing 4-vinyl-N-methylpyridinium pendant groups. However, it is observed that repeating units containing these pendant groups are to be limited to 10 percent or less on a mole basis to avoid compositions poor in photosensitivity and incapable of forming an aqueous solution.

Sanada et al, "New Deep UV Dyeable Negative Resist for CCD Micro Color Filter", SPIE, Vol. 631, Advances in Resist Technology and Processing III (1986), pp. 187-191, discloses for use in forming filter elements for charge coupled devices quaternary salt terminated acrylate-glycidyl methacrylate copolymers which are crosslinked by bisazides. One difficulty of the approach is that a separate compound, the bisazide, is relied upon for crosslinking. Variances in proportions of reactants will, of course, lead to non-uniformity of results. Another fundamental difficulty is the necessity of employing very short ultraviolet (hereinafter also referred to as UV) wavelengths for crosslinking. This excludes from use the most common pattern forming exposure equipment specifically developed for fabricating semiconductor devices.

CROSS REFERENCED COMMONLY ASSIGNED PATENT APPLICATIONS

Pace and Blood U.S. Ser. No. 876,510, filed June 20, 1986, titled COLOR FILTER ARRAYS, discloses a color filter array comprised of red, green, and blue filters forming an interlaid pattern. Each of the red, green, and blue filters is formed of two superimposed filter layers, each made up of a different subtractive primary dye. Layers of controlled thickness containing a single dye permit precise control of filter density and hue. The color filter array can form part of a viewable display unit or form part of an image sensor.

Applicants' U.S. Ser. No. 087,845, concurrently filed, and commonly filed, titled A PHOTOGRAPHIC ELEMENT AND PATTERNABLE MORDANT COMPOSITION, now U.S. Pat. No. 4,808,510 discloses a photographically negative-working patternable mordant composition containing a photocrosslinkable polymer comprised of, for providing both mordanting and crosslinking sites, repeating units of the formula:

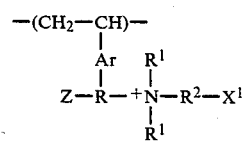

where
Ar is an aromatic linking group,

R is a methylene group,

R$^1$ is independently in each occurrence a lower alkyl group,

R$^2$ is a divalent linking group,

X$^1$ is a group comprised of an activated vinyl moiety capable of being photostimulated to produce a crosslinking group, and Z$^-$ is a charge balancing counter ion.

The mordant composition can be coated on a support to form a photographic element.

SUMMARY OF THE INVENTION

In one aspect this invention is directed to a color filter array comprised of interlaid sets of laterally displaced filters comprised of a polymeric matrix capable of providing cationic mordanting sites and at least one mordanted anionic dye. The color filter array is characterized in that at least one of the sets of filters is comprised of a cationic vinyl polymer mordant containing crosslinking repeating units consisting of two ethylenic units each forming a part of a different ethylenic polymer backbone, a quaternary ammonium mordanting moiety pendant from each of the two ethylenic units, and a moiety crosslinking the polymer backbones through the mordanting moieties photogenerated by the addition reaction of ethylenic groups.

In another aspect this invention is directed to a light sensing semiconductor device including an array of light sensing pixels each less than $1 \times 10^{-8}$ m$^2$ in area comprised of a semiconductive substrate including a light sensing portion in each pixel and a filter array for directing light to the semiconductive substrate comprised of interlaid sets of laterally displaced filters each overlying one pixel. The device is characterized in that at least one of the sets of filters is comprised of a cationic vinyl polymer mordant containing crosslinking repeating units consisting of two ethylenic units each forming a part of a different ethylenic polymer backbone, a quaternary ammonium mordanting moiety pendant from each of the two ethylenic units, and a photogenerated ethylenic moiety crosslinking the polymer backbones through the mordanting moieties.

In an additional aspect this invention is directed to a device for displaying color images on a viewable surface comprised of a plurality of laterally displaced pixel areas, means for modulating within each pixel area the luminance of light transmitted to the viewable surface and a filter array for controlling within each pixel area the chrominance of light transmitted to the viewable surface comprised of interlaid sets of laterally displaced filters each overlying one pixel. The device is characterized in that at least one of the sets of filters is comprised of a cationic vinyl polymer mordant containing crosslinking repeating units consisting of two ethylenic units each forming a part of a different ethylenic polymer backbone, a quaternary ammonium mordanting moiety pendant from each of the two ethylenic units, and a photogenerated ethylenic moiety crosslinking the polymer backbones through the mordanting moieties.

The present invention offers a number of distinct advantages over the prior state of the art. First, by providing a polymeric mordant which is directly crosslinked and thereby patterned by near UV and visible light the necessity of blending with it a photoresist polymer to form a filter element is eliminated. This increases the density of attainable mordanting sites and as a result allows thinner layers to provide a selected density of mordanted dye. The patterned mordant composition present in the filter elements of this invention exhibits desirably low levels of optical density (low stain), both as intially formulated and on aging. The mordant compositions from which the filter elements are formed are advantageous in exhibiting high levels of stability, both in solution and after coating. The mordants used to form the filter elements are conveniently patterned, since they respond to exposures within the wavelength regions of the near ultraviolet and the visible portions of the electromagnetic spectrum and since they can be developed following exposure using known aqueous and alcoholic developers.

In certain preferred forms of the invention, in which interlaid patterns of blue, green, and red filters are formed by superimposed filter elements each containing a single substractive primary dye, the further advantage is realized that the filters more accurately restrict light transmission to a single selected blue, green, or red region of the visible spectrum. At the same time the filters are by reason of their construction relatively invariant in both density and hue. Further, the filters can be spatially delineated with a high degree of precision, thereby permitting applications to be served requiring exceedingly small pixel areas. A specifically preferred form of the invention offers the advantage in facilitating spatial defintion in that individual filter components can occupy areas which are multiples of the areas of the pixels they form. This can markedly reduce the layer boundaries required to form interlaid filter patterns.

BRIEF DESCRIPTION OF THE DRAWING

The specific advantages of this invention can be better appreciated by reference to the description of preferred embodiments considered in conjunction with the drawings, in which.

Figure 1:
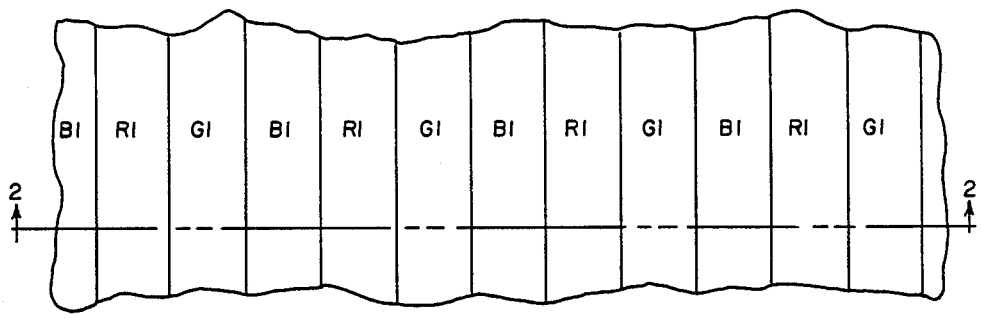
FIGS. 1 and 3 are plan details of two alternative filter arrays according to the invention.

Both absolute and relative dimensions of features in the drawings have been altered to facilitate depiction.

DESCRIPTION OF PREFERRED EMBODIMENTS

The color filter arrays of this invention are comprised of interlaid sets of laterally displaced filters comprised of at least one mordanted anionic dye and a polymeric matrix which provides cationic mordanting sites. Although the filter arrays can take specifically preferred forms, more specifically described below, the invention is generally applicable to conventional filter array patterns, including filter element configurations and dye hue combination selections.

In all forms of the invention at least one of the sets of filters is comprised of a cationic vinyl polymer mordant containing crosslinking repeating units consisting of two ethylenic units each forming a part of a different ethylenic polymer backbone, a quaternary ammonium mordanting moiety pendant from each of the two ethylenic units, and a photogenerated ethylenic moiety crosslinking the polymer backbones through the mordanting moieties.

A crosslinking repeating unit of this type can be illustrated by formula I:

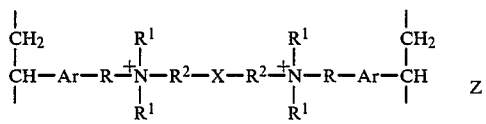

wherein, independently in each occurrence,

Ar is an aromatic linking group,

R is a methylene group, $R^1$ is a lower alkyl group, $R^2$ is a divalent linking group, X is a photogenerated crosslinking group, and Z represents one or more charge balancing counter ions.

The preparation of a filter element containing a mordant as above-described is achieved by coating on any conventional translucent, preferably transparent, or light sensing support element a photographically negative-working patternable mordant composition comprised of a triplet sensitizer capable of absorbing radiation in the visible and near ultraviolet portions of the spectrum and one or more photocrosslinkable polymers responsive to energy received from the triplet sensitizer to provide the crosslinking repeating units described. Formation of the filter element is completed by imagewise exposure of the coating to spatially define the pattern of the filter elements, development to remove unexposed mordant, and imbibition of the anionic dye or dyes.

The photocrosslinkable polymers employed in forming the filter elements of this invention are linear polymers formed by the addition polymerization of ethylenically unsaturated monomers and subsequent modification of pendant groups to form mordanting and crosslinking sites. The photocrosslinkable polymers contain at least one repeating unit capable of performing both a mordanting and crosslinking function of the type indicated by formula II:

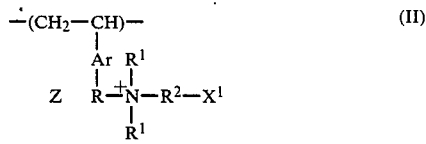

The repeating unit satisfying formula II can be formed by modifying the pendant group of a repeating unit in a linear addition polymer satisfying formula III:

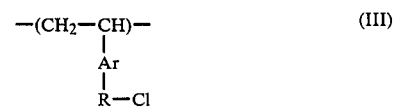

by reaction with a tertiary amine satisfying formula IV:

In each of formulae II, III, and IV:

Ar, R, $R^1$, $R^2$, and Z correspond to the definitions given for formula I and $X^1$ is a group comprised of an activated vinyl moiety capable of being photostimulated to produce a crosslinking group X.

The aromatic linking group Ar can be any convenient divalent aromatic group. The aromatic linking group is preferably an arylene group containing from 6 to 10 carbon atoms. Typical arylene groups are phenylene and naphthalene groups.

R is a methylene group. The methylene group can be an unsubstituted methylene group (i.e., a —$CH_2$— group) or any synthetically convenient substituted methylene group. An exemplary methylene group substituent can be a halogen atom, such as chlorine, or a lower alkyl group. The term "lower alkyl" is employed throughout this specification to indicate alkyl groups containing from 1 to 3 carbon atoms—i.e., methyl, ethyl, n-propyl, and i-propyl groups. $R^1$ can be in each occurrence independently selected from among lower alkyl groups.

$R^2$ can be any synthetically convenient divalent linking group. $R^2$ can be selected from among alkylene (e.g., alkylene of from 1 to 6 carbon atoms, such as methylene, ethylene, propylene, butylene, pentylene, hexylene, and any branched chain isomer of the foregoing); arylene (e.g., any of the forms of Ar defined above); arylenealkylene (e.g., composites of the alkylene and arylene moieties above containing from 7 to 16 carbon atoms); and —$C(O)OR^3$— or —$C(O)NR^3$—, where $R^3$ can take the form of any one of the divalent alkylene, arylene, and arylenealkylene moieties noted above.

$X^1$ is a group comprised of an activated vinyl moiety capable of being photostimulated to produce a crosslinking group X. When two activated vinyl moieties appended to separate polymer backbones enter into a photostimulated addition reaction, a 1,3-cyclobutylene crosslinking group is produced. Preferred activated vinyl moiety containing groups are those satisfying formula V or VI:

or

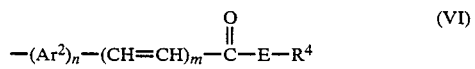

where:
Ar$^1$ is an aromatic moiety;
Ar$^2$ is a divalent aromatic moiety;
E is an oxy or imino moiety;
m is 1 or 2;
n is 0 or 1; and
R$^4$ is a terminal hydrocarbon group.

The aromatic moiety Ar$^1$ can take the form of any convenient aromatic nucleus. The aromatic nucleus can take the form of a five or six membered aromatic ring bonded directly to the vinyl group in formula IV. The aromatic ring can be either heterocyclic or carbocyclic. Aromatic heterocyclic ring substituents containing one or two chalcogen heteroatoms, such as 2-thienyl, 3-thienyl, 2-furyl, 3-furyl, and fused carbocyclic ring analogues thereof, are specifically contemplated. To avoid competition in the quaternization reaction the heterocyclic aromatic ring preferably does not contain a nitrogen atom. The aromatic nucleus can alternatively take the form of an aromatic carbocyclic nucleus, such as a phenyl or naphthyl nucleus. The aromatic nucleus can be either substituted or unsubstituted. For example, one or more alkyl substituents of from 1 to 6 carbon atoms are contemplated. It is generally preferred that the aromatic moiety contain less than about 15, optimally less than 12 total carbon atoms.

Ar$^2$ can be any convenient divalent aromatic moiety. For example, Ar$^2$ can differ from the aromatic moiety Ar$^1$ described above solely in being divalent rather than monovalent. In a specifically preferred form Ar$^2$ is a divalent arylene moiety of the type described above in connection Ar.

In each instance there is a direct bond between an aromatic ring carbon atom of Ar$^1$ and Ar$^2$ and the vinyl groups of formulae IV and V, respectively. When R$^2$ terminates in an arylene group, it is apparent that having the arylene group Ar$^2$ also present would result in two successive arylene groups separating the quaternized nitrogen atom of formula I and the vinyl group of formula V. Therefore, in this instance n is preferably zero.

The oxycarbonyl or iminocarbonyl moiety —E—C-(O)— is an electron withdrawing group that acts in combination with the aromatic ring attached to the opposite terminus of the vinyl group in formulae IV and V to provide a suitably activated vinyl group. The third bond of the imino nitrogen atom can be satisfied by hydogen or any convenient hydrocarbon substituent, such as alkyl of from 1 to 6 carbon atoms, optimally a lower alkyl group, or an aromatic group of from 6 to 10 carbon atoms (e.g., phenyl or naphthyl). The oxy and imino moieties facilitate sensitization in the near ultraviolet and visible regions of the spectrum.

R$^4$ can be any convenient terminal hydrocarbon group. R$^4$ can be an aryl group, preferably of from 6 to 10 carbon atoms (e.g., phenyl or naphthyl) or an alkyl group, preferably of from 1 to 6 carbon atoms, optimally a lower alkyl group.

It is appreciated that the activated vinyl aromatic moieties of formulae V and VI are merely exemplary of some of the simpler of many varied forms that these groups can take. Activated vinyl aromatic moieties with plural vinyl groups, elaborated linking groups, or containing other heteroatoms are all possible, but are not required and in many instances encumber the synthesis or bulk of the mordant without offering compensating advantage.

Specifically preferred pendant mordanting and crosslinking groups are formed by esterifying a tertiary amine of formula VII

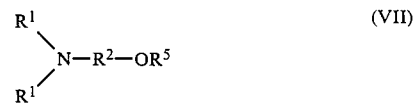

with cinnamic acid or an analogous acid to produce the tertiary amine VIII

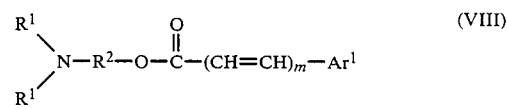

wherein
Ar$^1$, m, R$^1$, and R$^2$ are as previously defined and
R$^5$ is hydrogen or a terminal hydrocarbon group, preferably of the type indicated above in connection with R$^4$.

Although the foregoing activated vinyl moiety containing groups are preferred, other variations in their structural form are possible. For example, the activated vinyl moiety can take the form indicated by formula IX:

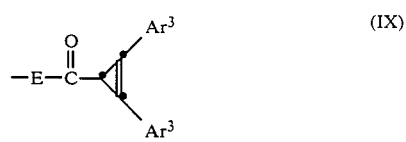

where
Ar$^3$ are independently selected as indicated above in connection with Ar$^1$ and
E is selected as previously described.

In a specifically preferred form the activated vinyl moiety of formula IX takes the form of an oxycarbonyl-3-(1,2-diarylpropene).

Z can be any convenient charge balancing counter ion. If the synthetic route indicated by formulae III and IV is followed in preparing the repeating unit of formula II, Z will initially be a chloride anion. However, the chloride anion can be readily exchanged with any other convenient anion, such as bromide, iodide, p-toluene sulfonate, trifluoroborate, etc.

Since the repeating units of formula II provide both a mordanting and crosslinking capability, they can form the entire patternable mordant polymer molecule. The repeating units of formula II can take any combination of the varied forms described above within a single polymer molecule. It is generally synthetically convenient to form all of the repeating units of formula II at once. Mixtures of tertiary amines satisfying formula IV can be conveniently employed to vary the structure of the repeating units formed. In a specifically contemplated form of the invention the patternable mordant is a homopolymer in which the repeating units of formula II are formed by reacting a single polymeric repeating unit satisfying formula III with a single tertiary amine satisfying formula IV.

While forming the entire patternable mordant of repeating units satisfying formula II is contemplated, it is not required. Satisfactory photocrosslinking to permit selective removal by development of unexposed polymer can be achieved when only a minor proportion of the patternable mordant molecule is comprised of repeating units satisfying formula II. It is preferred that at least 20 percent on a mole basis of the repeating units making up the final polymeric mordant satisfy formula I or II. In more preferred final polymeric mordants from about 30 to 60 percent, on a mole basis, of the repeating units satisfy formula I or II.

The number of repeating units satisfying formula I created from repeating units satisfying formula II on exposure need be no more than is required to allow adequate development. That is, no more crosslinking repeating units need be present than is needed to render the mordant coating insoluble on development. Generally satisfactory discrimination between exposed and unexposed areas is realized on development when the repeating units satisfying formula I account for from 1 to 5 percent of the total repeating units forming the mordant polymer. The repeating units satisfying formula II which are not converted to units satisfying formula I serve the useful function of maintaining a high sensitivity level of the patternable mordant on exposure and, following exposure and development, are useful as mordanting sites and lend other useful properties to the mordant polymer, similarly as optional repeating units XI, described below.

While not every repeating unit of the patternable mordant need provide a crosslinking site, it is generally preferred for maximum mordanting capacity that each of the repeating units provide a mordanting site. A patternable mordant containing, in addition to the repeating units of formula II providing both mordanting and crosslinking sites, repeating units capable of mordanting, but not crosslinking, can be conveniently formed by blending a tertiary amine satisfying formula X with a tertiary amine satisfying formula IV and then reacting the mixture with a polymer having repeating units satisfying formula III,

wherein $R^6$ is independently in each occurrence a hydrocarbon group or an oxy substituted hydrocarbon group containing from 1 to 16 carbon atoms, provided that in at least two occurrences $R^6$ contains from 1 to 3 carbon atoms.

The hydrocarbon moieties of $R^6$ are preferably chosen from among alkyl, including cycloalkyl, or alkenyl containing from from 1 to 6 carbon atoms, aryl containing 6 to 10 carbon atoms, or alkaryl containing 7 to 16 carbon atoms.

In at least one occurrence $R^6$ can and preferably is chosen to enhance the characteristics of the patternable mordant in one or more respects. When $R^6$ is an alkenyl group, it can provide an auxiliary crosslinking site. For example, $R^6$ can provide a site for thermally induced crosslinking. In a specifically preferred form $R^6$ is an allyl group. When $R^6$ contains an oxy substituent, such as a hydroxy or alkoxy ($C_{1-3}$) substituent, it can promote adhesion of overcoated polymeric layers. For example, in forming filter elements employing patternable mordants, it is contemplated that successive layers may be coated, each imbibed with a different dye to be mordanted. Particularly preferred oxy substituted alkyls are omega-hydroxyalkyls—e.g., $\beta$-hydroxyethyl, $\gamma$-hydroxypropyl, $\beta,\gamma$-dihydroxypropyl, and the like.

The tertiary amine of formula X competes with the tertiary amine of formula IV to form repeating units satisfying formula XI:

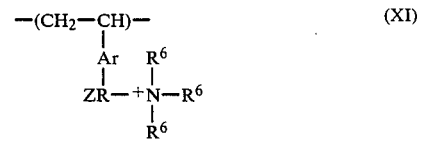

where Ar, R, $R^6$, and Z are as previously described.

From the foregoing it is apparent that the patternable mordants of the invention can be readily formed with every repeating unit of the mordant polymer providing a mordanting site and with the ratio of mordanting sites to crosslinking sites being readily controlled, as desired, merely by selecting the ratio of tertiary amines satisfying formulae IV and V.

Although the invention is capable of providing a mordanting site within each repeating unit of the patternable mordant polymer and this is usually preferred, the invention is not restricted to this form. If, instead of choosing a homopolymer satisfying formula III another conventional polymer having only a portion of its repeating units satisfying formula III is substituted, it is apparent that the number of mordanting sites can be regulated at will. In addition to the formula III repeating units, the starting polymer can contain any one or combination of conventional vinyl addition polymer repeating units. For example, acrylic and methacrylic acid, ester, and amide repeating units; vinyl alcohol; styrene repeating units; and alkylene (e.g., ethylene and propylene) repeating units are all contemplated. It is generally preferred that repeating units satisfying formulae I, II, and XI account for at least 50 percent, optimally at least 90 percent, on a mole basis of the patternable mordant.

The patternable mordants used in forming the crosslinked mordants contained in the filter elements of this invention are linear polymers which can be dissolved in hydrogen bonding polar solvents. Preferred polymers are those which can be dispersed in aqueous or alcoholic solutions. Polymer molecular weights (weight average) in the range of from about 20,000 to 200,000, preferably about 40,000 to 150,000, are well suited to achieving clean removal by common developers. Polymer molecular weights, unless otherwise indicated are understood to be measured by the size exclusion chromatography method, described in detail in "Modern Size Exclusion Liquid Chromotography", W. W. Yau, J. J. Kirkland, and D. D. Bly, Wiley Interscience, J. Wiley & Sons, 1979. The weights are related to polystyrene standards.

While the activated vinyl groups of the patternable mordant polymer are capable of responding directly to shorter wavelength UV radiation, to achieve photocrosslinking by exposure to the near UV and visible portions of the spectrum a sensitizer is incorporated in the patternable mordant composition. The sensitizers are not, however, either an essential or preferred part of the filter elements of this invention, since initially present sensitizers are usually leached from the mordant composition during development. Preferred sensitizers can be selected from among a variety of conventional sensitizers known to extend spectral response to the "near UV" (290 to 390 nm) or visible portion to the spectrum. Among specifically preferred classes of sensitizers are 3-substituted coumarins. Such sensitizers are disclosed by Specht et al U.S. Pat. No. 4,147,552, the disclosure of which is here incorporated by reference, and 2-(heterocyclcarbonylmethylene)thiazolines and selenazolines as well as 2-[di(heterocyclylcarbonyl)methylene]thiazolines and selenazolines, disclosed in Van Allan et al U.S. Pat. Nos. 4,062,686 and 4,119,466, the disclosures of which are here incorporated by reference.

No other ingredients beyond the patterned mordant polymer and an imbibed, mordanted anionic dye are required in a filter element according to this invention.

In a preferred form of the invention the mordant polymer both before and after patterning is "colorless"—quantitatively defined as exhibiting an absorption of less than 0.02 density unit, preferably less than 0.01 density unit, within the visible spectrum at coating thicknesses of up to 25 $\mu$m. None of the repeating units I, II, III, and XI contain a chromophore capable of contributing color within the visible spectrum. Further, the common repeating units of vinyl addition polymers, including those named above, that might be employed for producing copolymers similarly lack chromophores.

To the extent that the sensitizers absorb light within the near UV portion of the spectrum they need not be colored. Where a colorless sensitizer is employed, it is immaterial whether it remains in the patterned mordant or is removed.

The sensitizers which absorb light within the visible spectrum necessarily impart a color to the mordant composition. Fortunately, the same development and washing procedures which remove mordant in unexposed areas also effectively remove the preferred sensitizers described above from exposed areas. Should a sensitizer be encountered which is not removed on normal development and washing, it is recognized that the smaller sensitizer concentrations contemplated are in themselves adequate to minimize unwanted retained color in the patterned mordant composition in many instances.

Any conventional mordantable anionic dye can be employed in the mordant compositions of this invention. The mordantable dyes disclosed by McGuckin and Cohen U.S. Pat. No. 4,220,700, here incorporated by reference, are cited as illustrative.

Exemplary preferred yellow, magenta, and cyan dyes are listed in Table I.

TABLE I

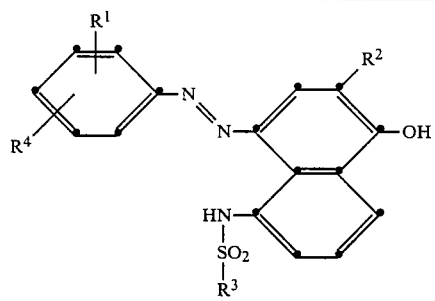

(I)

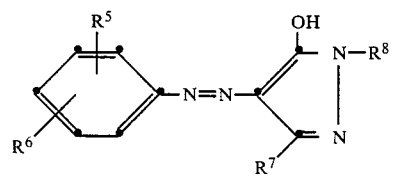

(II)

TABLE I-continued
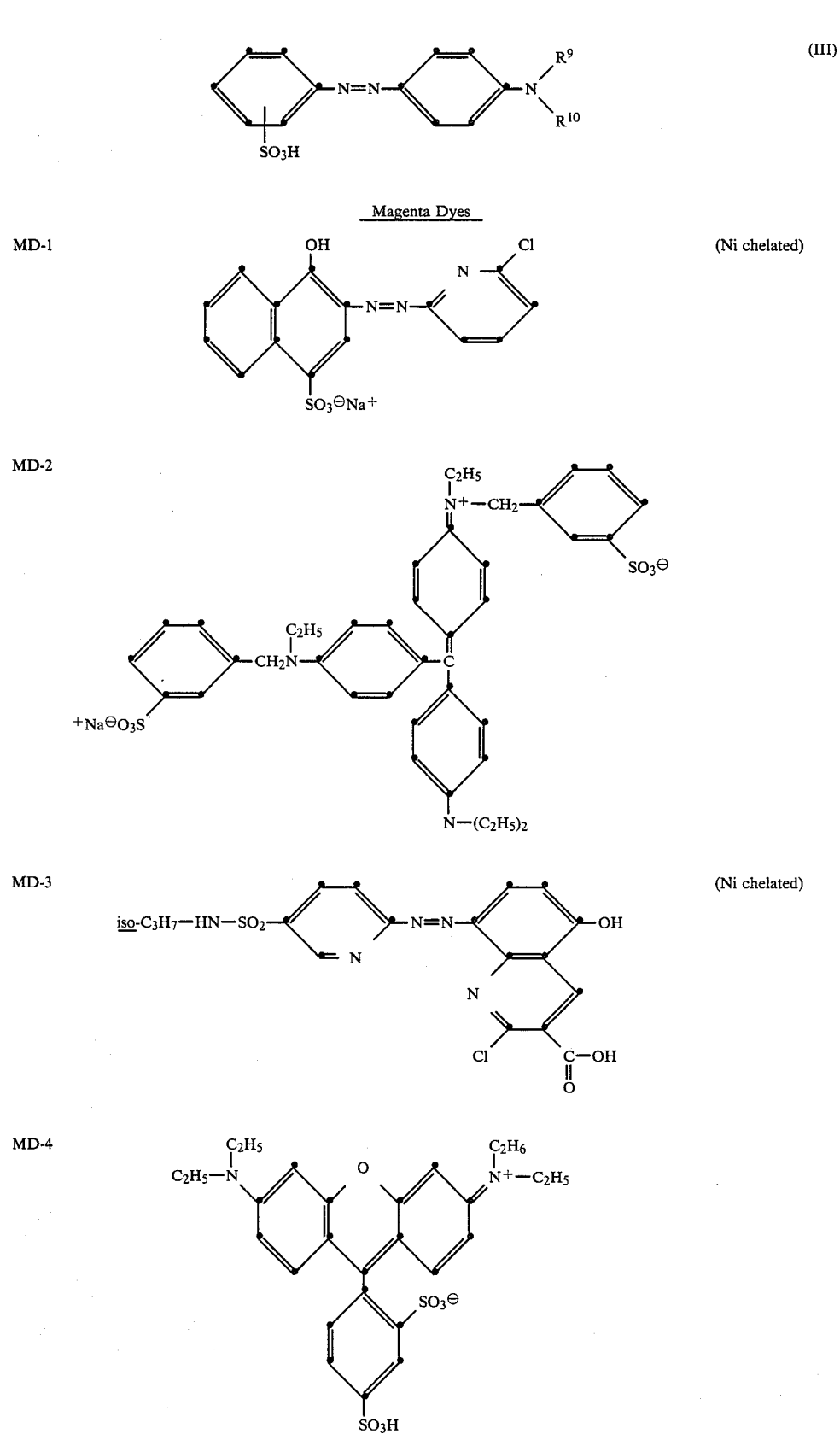

TABLE I-continued

MD-5 (Ni chelated)

MD-6 (Ni chelated)

MD-7 (Ni chelated)

MD-8 (Ni chelated)

MD-9 (Ni chelated)

MD-10

MD-11 (Ni chelated)

TABLE I-continued

MD-12
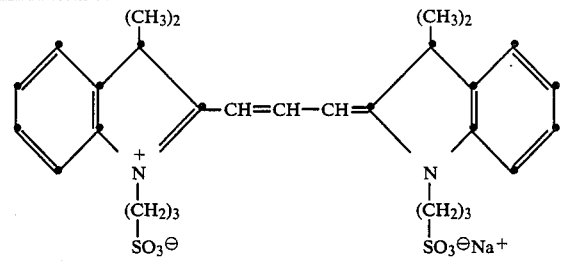

| Dye No. | R¹ | R² | R³ | R⁴ |
|---|---|---|---|---|
| MD-13 | —4-SO₂NH₂ | —SO₂NHCH₂CO₂H | —CH₃ | H |
| MD-14 | —3-CO₂H | —SO₂NHC(CH₃)₃ | —CH₃ | H |
| MD-15 | —4-SO₃H | —SO₂NHCH₂CO₂H | —CH₃ | H |
| MD-16 | —3-SO₂NH₂ | —SO₂NHCH₂CO₂H | —CH₃ | H |
| MD-17 | —3-SO₂CH₃ | —SO₂NHCH₂CO₂H | —CH₃ | H |
| MD-18 | —3-SO₃H | —SO₂NHCH₂CO₂H | —CH₃ | —2-Cl |
| MD-19 | —3-SO₃H | —SO₂NHCH₂CO₂H | —CH₃ | —4-Cl |
| MD-20 | —3-SO₃H | —SO₂C₂H₄CO₂H | —CH₃ | H |

Yellow Dyes

YD-1
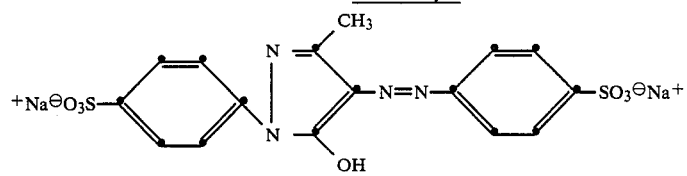

YD-2
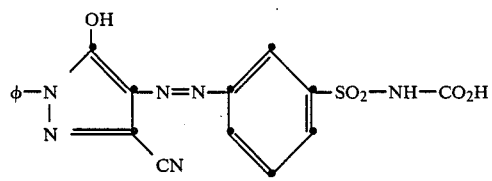

YD-3    Drimarine ® Brilliant Yellow K-362 (a monoazo dye with a chloropyrimidine reactive group)

YD-4
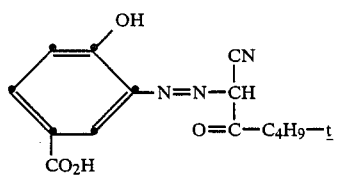
(Ni chelated)

YD-5
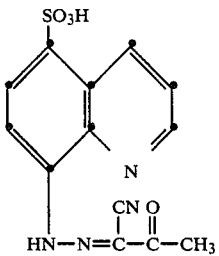
(Ni chelated)

YD-6
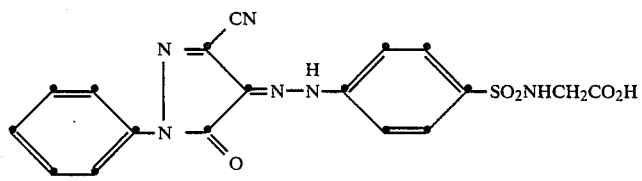

TABLE I-continued
YD-7
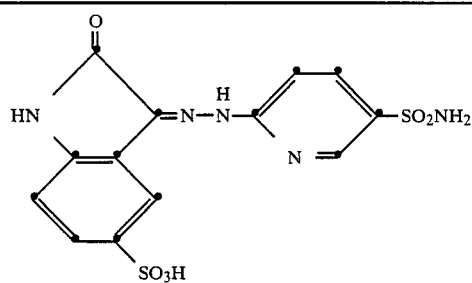
YD-8
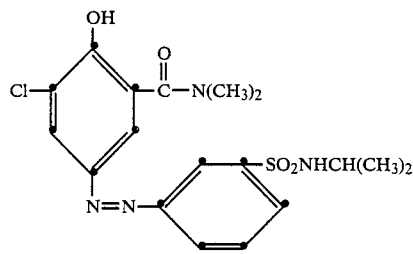
YD-9
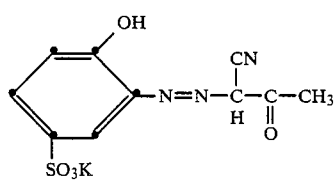
YD-10
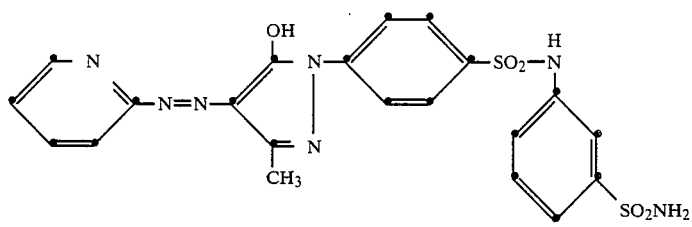
YD-11
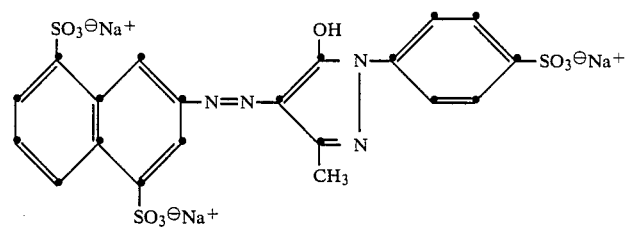
| Dye No. | $R^5$ | $R^6$ | $R^7$ | $R^8$ |
| --- | --- | --- | --- | --- |
| YD-12 | —4-SO$_3$H | H | —CH$_3$ | 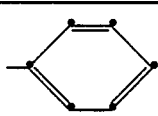 |
| YD-13 | —3-SO$_2$NH$_2$ | 5-CO$_2$H | —CN |  |
| YD-14 | —3-SO$_2$NHCH$_2$CO$_2$H | H | —CN | 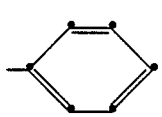 |

TABLE I-continued

| Dye No. | | | | |
|---|---|---|---|---|
| YD-15 | —4-SO$_3$H | H | H | (phenyl) |
| YD-16 | —4-SO$_3$H | H | —OH | (phenyl) |
| YD-17 | —4-SO$_2$NH$_2$ | H | —OH | (phenyl-SO$_3$H) |
| YD-18 | —4-SO$_3$H | H | —CONH$_2$ | (phenyl) |
| YD-19 | —3-Cl | H | —CH$_3$ | (phenyl-CO$_2$H) |
| YD-20 | —3-CO$_2$H | H | —CH$_3$ | (phenyl-CO$_2$H) |
| YD-21 | —3-SO$_2$NHCH$_2$CO$_2$H | H | —CN | (phenyl) |

| Dye No. | R$^9$ | R$^{10}$ |
|---|---|---|
| YD-22 | —C$_2$H$_5$ | —C$_2$H$_4$SO$_3$H |
| YD-23 | —CH$_3$ | —CH$_3$ |
| YD-24 | —C$_2$H$_5$ | —C$_2$H$_4$NHSO$_2$CH$_3$ |

Cyan Dyes

CD-1 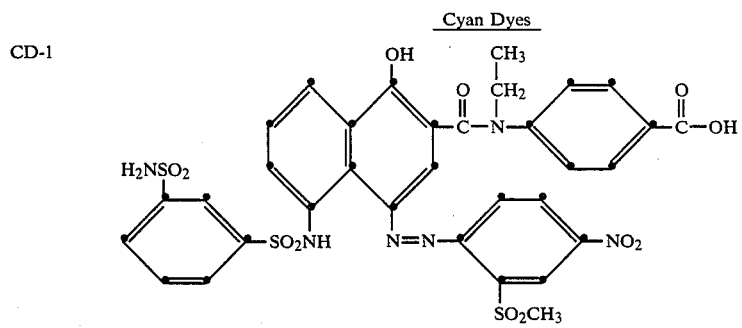

CD-2  Copper phthalocyanine tetrasulfonic acid, tetrasodium salt

CD-3  Procion ™ turquoise HA (a sulfonated copper phthalocyanine containing a monochloro-triazine reactive group)

TABLE I-continued

CD-4 (Ni chelated)

CD-5 (Ni chelated)

CD-6

CD-7

| Dye No. | $R^1$ | $R^2$ | $R^3$ | $R^4$ |
|---|---|---|---|---|
| CD-8 | —2-SO$_2$(CH$_2$)$_2$CO$_2$H | —SO$_2$NHCH$_2$CO$_2$H | —CH$_3$ | 4-NO$_2$ |
| CD-9 | —2-SO$_2$(CH$_2$)$_2$CO$_2$H | Cl | 4-SO$_2$NH$_2$-phenyl | 4-NO$_2$ |
| CD-10 | —2-SO$_2$(CH$_2$)$_2$CO$_2$H | —SO$_2$NHC(CH$_3$)$_3$ | 4-SO$_2$NH$_2$-phenyl | 4-NO$_2$ |
| CD-11 | —2-SO$_2$(CH$_2$)$_2$CO$_2$H | —SO$_2$NH—t-C$_4$H$_9$ | 4-CO$_2$H-phenyl | 4-NO$_2$ |

TABLE I-continued

| | | | | |
|---|---|---|---|---|
| CD-12 | —2-SO$_2$(CH$_2$)$_2$CO$_2$H | —SO$_2$NHCH$_3$ | (phenyl)-SO$_2$NH$_2$ | 4-NO$_2$ |
| CD-13 | —2-SO$_2$(CH$_2$)$_2$CO$_2$H | —SO$_2$N(morpholino)O | (phenyl)-SO$_2$NH$_2$ | 4-NO$_2$ |
| CD-14 | —2-SO$_2$CH$_3$ | Cl | (phenyl)-SO$_3$H | 4-NO$_2$ |
| CD-15 | —2-SO$_2$(CH$_2$)$_2$CO$_2$H | —SO$_2$N(C$_2$H$_5$)$_2$ | (phenyl)-SO$_2$NH$_2$ | 4-NO$_2$ |
| CD-16 | —2-SO$_2$(CH$_2$)$_2$CO$_2$H | —SO$_2$N(CH$_3$)$_2$ | —CH$_3$ | 4-NO$_2$ |

The preferred anionic dyes can be readily dissolved in a polar solvent for imbibition into a filter layer. Aqueous dye solutions can be employed. However, any other convenient polar solvent compatible with the filter layer can be employed or in combination with water, if desired, such as, for example, methanol, ethanol, dimethylsulfoxide, dioxane, ethanolamine, or mixtures thereof. Preferred solvents are those which increase the amount of dye which can be imbibed into the filter layer. Typically a small amount of a surfactant is also added to the dye solution to facilitate wetting of the filter layer.

In certain preferred filter element constructions, more specifically described below, two superimposed layers each containing a different imbibed dye are employed to construct a single filter element. As a means of insuring that each dye is confined to a single filter layer, barrier layers between contiguous filter layers containing differing dyes can be employed. Useful barrier materials are known in the art and include, for example, nitrocellulose, poly(glycidyl methacrylate), poly(methyl methacrylate), and poly(isopropenyl ketone).

Polyester ionomers constitute a preferred class of barrier materials. A particularly preferred class of polymers which meets the above described criteria are photocrosslinkable polyester ionomers. In preferred polyester ionomers the polyester contains at least one aromatic dicarboxylic acid derived repeating unit which contains an alkali metal sulfonate group or an iminodisulfonyl unit containing monovalent cations as imido nitrogen atom substituents. Photocrosslinkable polyester ionomers preferably contain a dicarboxylic acid derived repeating unit containing non aromatic ethylenic unsaturation capable of providing crosslinking sites.

In particularly preferred forms, the polyesters contain at least three dicarboxylic acid derived repeating units. One dicarboxylic acid derived repeating unit is the photocrosslinking unit. This unit crosslinks with similar units on other polymer chains on exposure to activating radiation as described previously. Another dicarboxylic acid derived repeating unit is the hydrophobic unit. The third dicarboxylic acid derived repeating unit is a unit comprising a sulfonate ionic group, i.e., a hydrophilic unit. The photocrosslinking unit can comprise from 30 to 90 and preferably from 30 to 70 mole percent of the total acid units of the polyester. The hydrophobic and ionic units can comprise from 5 to 50 and from 2 to 40 mole percent, respectively, of the total acid units of the polyester. The photocrosslinking group can be either part of the polymer backbone or pendent therefrom.

Specific examples of polyester ionomers and their utility in forming barrier layers can be found in Arcesi et al U.S. Pat. No. 3,929,489, Wagner et al U.K. Pat. No. 1,407,059, and Hartman U.S. Pat. No. 4,315,978. Polyester ionomers are preferred barrier materials, since they are highly effective even when coated as thin layers.

Particularly preferred polyester ionomers are listed in Table II. According to convention, the glycol portion of the polyester is listed first, with the molar percentages following in parenthesis when more than one glycol portion is present, which is in turn followed by the carboxylic acid portions of the polyester, and the mole percentages of these portions listed in parenthesis.

TABLE II

| | |
|---|---|
| PEI-1 | Poly[ethylene-co-1,4-cyclohexylenedimethylene (70:30) 1,1,3-trimethyl-3-phenyl-5,4'indan-dicarboxylate-co-3,3'-sodioiminodisulfonyl-dibenzoate (45:50:5)] |
| PEI-2 | Poly[ethylene-co-1,4-cyclohexylenedimethylene (70:30) 1,1,3-trimethyl-3-phenyl-5,4'-indandicarboxylate-co-3,3'-(1,4-phenylene)diacrylate-co-5-(4-sodiosulfophenoxy)-1,3-benzenedicarboxylate (45:50:5)] |
| PEI-3 | Poly[1,4-cyclohexylenebis(oxyethylene)-3,3'(1,4-phenylene)diacrylate-co-3,3'-sodioiminosulfonyldibenzoate (95:5)] |

The color filter arrays of this invention are formed of two, three, or more sets of interlaid filter elements. The filter elements differ in their spectral region of transmission. Individual filter elements are usually of a primary hue, either a subtractive primary hue (that is, absorbing blue, green, or red light and transmitting light from the remainder of the visible spectrum) or an additive primary hue (that is, transmitting blue, green, or red light and transmitting light from the remainder of the visible spectrum). The filter elements can contain one or a plurality of dyes. Where a plurality of dyes are present in a single filter element, the dyes can be mixed or segregated in separate layers. The filter elements can, through appropriate dyes and geometrical shapes, form any conventional pattern. Illustrations of differing filter patterns are provided by Bayer U.S. Pat. No. 3,971,065, Yamanaka U.S. Pat. No. 4,064,532, Blazey et al U.S. Pat. No. 4,307,165, Whitmore U.S. Pat. No. 4,387,146, Hirofumi et al U.S. Pat. No. 4,383,017, Aono U.S. Pat. No. 4,386,144, and Gilmour et al U.S. Pat. No. 4,411,973, here incorporated by reference.

In a specifically preferred form of the invention the color filter arrays exhibit interlaid patterns of blue, green, and red filters, each filter being laterally displaced with respect to the remaining filters. Although not required, for most applications all filters conveniently lie in a common plane, such as on a common planar support surface.

Figure 3:
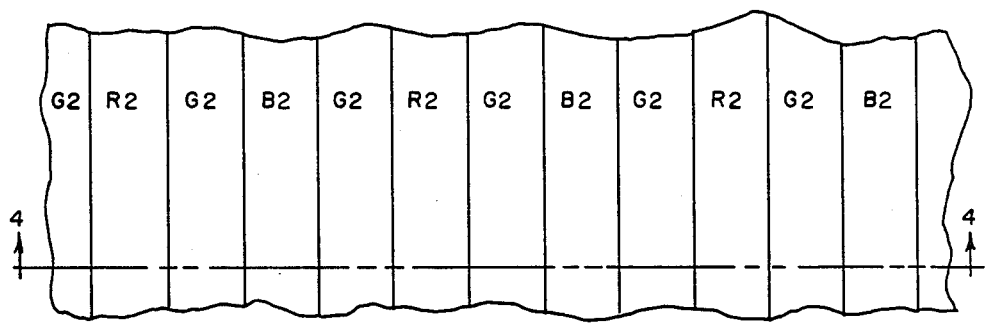

Since electronic imaging is currently most commonly practiced with orthogonal patterns, the preferred color filter arrays of the invention are illustrated by reference to orthogonal patterns. Two simple filter arrays of differing patterns are shown in FIGS. 1 and 3, in which blue, green, and red filters B1, G1, and R1 in FIG. 1 and B2, G2, and R2 in FIG. 3 take the form of stripes lying in a common plane. The filter array of FIG. 1 contains an equal number of blue, green, and red filters, while the filter array of FIG. 3 provides one blue, one red, and two green stripes in each repeating sequence. The reason for relatively increasing the frequency of green stripes is that the human eye derives most of its information from green portion of the spectrum. Thus, it is often desirable to give added weighting to green light in image sensors.

Figure 2:
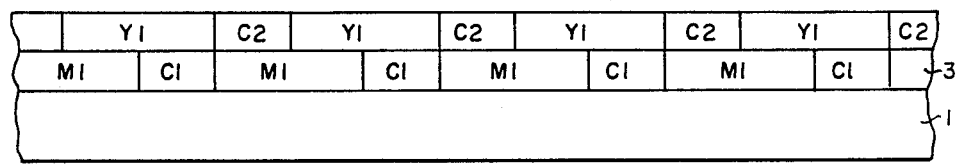
FIG. 2 is a sectional view taken along section line 2—2 in FIG. 1.

One possible construction of the filter array of FIG. 1 is shown in FIG. 2. A transparent support 1 presents an upper surface 3 on which are positioned two, separate interlaid layers. A layer M1 contains a first subtractive primary dye, in this instance a magenta dye, and a layer C1 contains a second subtractive primary dye, in this instance a cyan dye. Overlying the layers M1 and C1 are positioned two, separate interlaid layers, C2 and Y1. The layer C2 also contains a second subtractive primary dye, in this instance a cyan dye, and the layer Y1 contains a third subtractive primary dye, in this instance a yellow dye.

It can be seen that each of the blue, green, and red filters is formed of two layers. The blue and red filters share the common magenta layer M1. The green and red filters share the common yellow layer Y1. The lower layer C1 of each green filter and the upper layer C2 of each blue filter contain a cyan dye. The layers C1 and C2 can, but need not, contain the same cyan dye. Further, since the layers C1 and C2 are contiguous, it is apparent that they can together form a single layer forming the upper layer of blue filters and the lower layer of green filters.

It is appreciated that the specific layer choices shown to form the color filter array pattern of FIG. 1 are only exemplary of several alternative layer choices. In the filter construction of FIG. 2 the layer locations of the magenta and yellow dyes can be interchanged. Similarly, the layer locations of the cyan and yellow or cyan and magenta dyes can be interchanged. Also, the position of the two upper layers can be interchanged that of the two lower layers.

Figure 4:
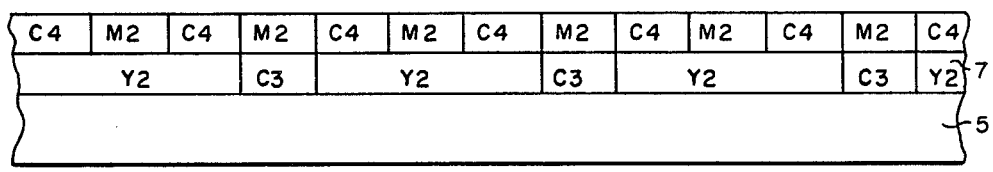
FIG. 4 is a sectional view taken along section line 4—4 in FIG. 3.

An exemplary construction of the color filter array of FIG. 3 is shown in FIG. 4. A transparent support 5 is shown to present an upper surface 7 on which are positioned two, separate interlaid layers. A layer Y2 contains a first subtractive primary dye, in this instance a yellow dye, and a layer C3 contains a second subtractive primary dye, in this instance a cyan dye. Overlying the lower layers Y1 and C3 are positioned two, separate interlaid layers, M2 and C4. The layer C4 also contains a second subtractive primary dye, in this instance a cyan dye, and the layer M2 contains a third subtractive primary dye, in this instance a magenta dye.

It can be seen that each of the blue, green, and red filters is formed of two layers. The green and red filters share the common yellow layer Y2. The blue and red filters share the common magenta layer M2. The lower layer C3 of each blue filter and the upper layer C4 of each green filter contain a cyan dye. The layers C3 and C4 preferably contain the same cyan dye. Further, since the layers C3 and C4 are contiguous, it is apparent that they can together form a single layer, which forms the upper layer of green filters and the lower layer of blue filters.

It is appreciated that the specific layer choices shown to form the color filter array pattern of FIG. 3 is only exemplary of several alternative layer choices. In the filter construction of FIG. 4 the layer locations of the cyan and yellow dyes can be interchanged. Also, the two upper layers can be interchanged in position with the two lower layers. Interchanging the magenta dye with either the yellow or cyan dye will change the relative frequency of green, blue, and red filters, but can be undertaken, if this result is intended for a specific application.

In the filter array patterns of FIGS. 1 and 3 the widths of the blue, green, and red stripes are normally chosen to coincide with the desired width of individual pixels, but the stripes are not capable of defining the orthogonal areal dimension—e.g., the length—of the pixels. Another element used with the filter array, such as an array of image sensors or a conventional luminance modulator, is relied upon to define the length of each pixel.

As employed herein the term "pixel" is defined as a single areally limited information unit of an image. The number of pixels making up an image can be widely varied, depending upon the application. In the United States a broadcast television image contains approximately 262,144 pixels. While filter arrays containing far fewer pixels can be employed for conveying information in image form, for pictorial imaging filter arrays according to this invention containing at least about $2 \times 10^5$ pixels are contemplated, with megapixel filter arrays, those with at least $1 \times 10^6$ pixels, being contemplated for producing images of high visual quality.

Figure 5:
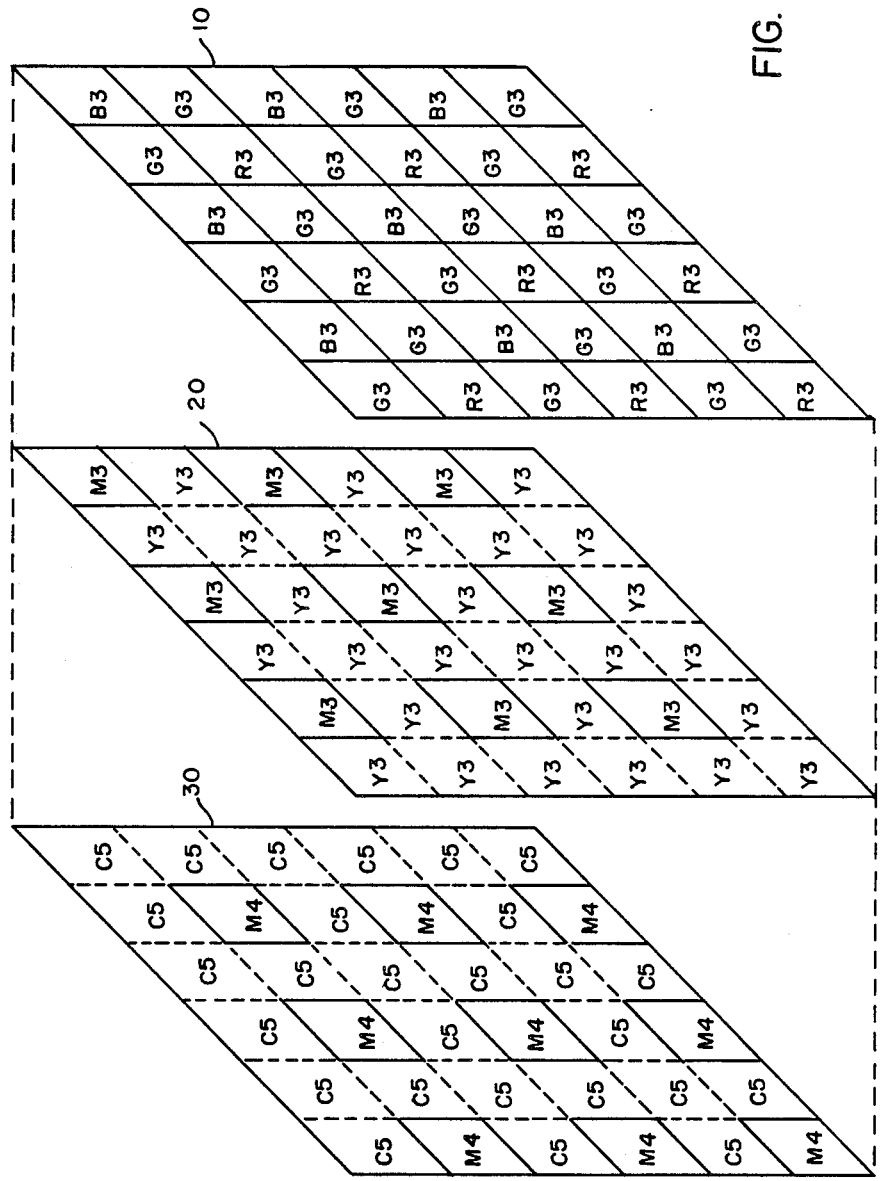
FIG. 5 is an expanded isometric detail of 36 pixels showing the spatial relationship of a third filter array and the layers which form the array.

It is possible to construct filter arrays according to the present invention in which individual blue, green, and red filters are each limited to a single pixel. In FIG. 5 is shown an exemplary pattern 10 of single pixel blue filters B3, green filters G3, and red filters R3. The layer arrays 20 and 30 show two subtractive primary layer patterns which can be superimposed to produce the blue, green, and red filter pattern. The layer array 20 is comprised of two layers Y3 and M3, containing a yellow dye and a magenta dye, respectively. The layer array 30 is comprised of two layers M4 and C5, containing a cyan dye and a magenta dye, respectively. The layer Y3 is restricted to areas forming filters G3 and R3. The layer C5 is restricted to areas forming the filters G3 and B3. The layer M3 is restricted to areas forming the filters B3 while the layer M4 is restricted to areas forming the filters R3.

Within the 36 pixel detail of the layer arrays shown, boundaries separating adjacent layers also form pixel boundaries. Pixel boundaries which are not layer boundaries are indicated by dashed lines. Within each layer array only half of the pixel boundaries require layer boundaries to be formed. Thus, the layer boundary requirements are considerably relaxed by this array construction.

FIG. 5, being schematic in nature, shows no support for the layer arrays. Either of the layer arrays can be coated nearest to a support with the remaining layer array overlying. As in the case of filter array of FIGS. 3 and 4, the cyan and yellow filters can be interchanged in position, if desired. The layers M3 and M4 can, if desired, contain the same magenta dye and can, if desired, be simultaneously formed using a single coating composition. The exemplary pixel defining filter pattern of FIG. 5 is noted to contain a disproportionate weighting of green to red and blue filters similar to that of FIGS. 3 and 4. However, it is appreciated that a pixel limited interlaid pattern of equal numbers of blue, green, and red filters could, if desired, be formed.

The filter arrays of FIGS. 1 through 5 rely on two superimposed layers, each containing a different subtractive primary dye, to produce each filter. This arrangement offers advantages in light transmission and absorption as compared to employing a filter constructed of an additive primary dye. To be effective an additive primary dye must transmit light in one of the blue, green, or red portions of the spectrum and efficiently absorb light in the remaining two thirds of the visible spectrum. For example, a filter containing a single green dye ideally requires a dye that transmits light from 500 to 600 nm while efficiently absorbing light from 400 to 500 nm and from 600 to 700 nm. These ideal green filter requirements can be much more easily approximated using two layers, one containing a yellow dye and one containing a cyan dye. Note that both the yellow and cyan dyes must transmit light efficiently in the 500 to 600 nm range. While the cyan dye is predominately transmissive in the 400 to 500 nm range and the yellow dye is predominately absorptive in this wavelength range, the two dyes together can be effective with any combination of absorption and transmission properties in this spectral range that efficiently absorbs light. The same is true of the 600 to 700 nm region of the spectrum. Thus, while a green dye must be chosen to satisfy a rather rigid absorption and transmission profile, a cyan dye and a yellow dye can be employed in separate layers according to this invention with much more latitude in dye absorption and transmission characteristics being possible. The same considerations apply to the construction of blue and red filters.

In a preferred form of this invention at least one and preferably each of the filter layers is of controlled thickness and contains a single subtractive primary dye. The use of a single subtractive primary dye allows the hue (i.e., the spectral absorption and transmission profile) of the layer be more precisely controlled than is possible using a combination of dyes. A difference in proportions of either additive or subtractive primary dyes in combination has the unfortunate effect of shifting layer hue, while the use of a single dye entirely avoids this difficulty.

Employing filter layers of controlled thickness further enhances control of light absorption and transmission. The optical density of a filter layer is a direct function of the amount of dye it contains within a given area. Layers of uniform thickness containing a uniform dye concentration exhibit uniform optical density. While uniform optical density is theoretically possible by controlling the application of a dye to a non-uniform layer, in practice this has not been possible with commonly employed dye distribution techniques.

The filter layers are areally limited so that they occupy areas corresponding to no more than two of the three additive primary filter sets being constructed. While any feasible technique for limiting the areal extent of the filter layers is within the contemplation of this invention, for applications requiring limited areas of individual pixels, such as pixels of $1 \times 10^{-8}$ m$^2$ or less, the filter layers are most conveniently constructed by photopatterning.

A photopatterned filter layer is most conveniently constructed by coating a solution of a photoinsolubilizable material onto a planar support surface. After coating, the support is spun, creating centrifugal forces acting on the coated composition which shape it into a layer of uniform thickness. Thereafter solvent, most typically water, is removed by drying the layer either at ambient or elevated temperatures. The resulting solid layer is then exposed imagewise to actinic radiation, typically ultraviolet radiation, to define the desired pattern. After exposure, the layer is brought into contact with a developer which selectively washes off the layer in unexposed areas. The support bearing the layer is typically immersed in the developer or spun while being sprayed with the developer to insure uniform developer contact.

After the patterned filter layer is formed, it is preferably dyed with a single subtractive primary dye. This can be achieved by bringing the dye in solution into contact with the filter layer and imbibing the dye into the filter layer. As the dye enters the layer by imbibition, the filter layer increases in optical density in direct relation to the amount of dye imbibed. As saturation of the filter layer by the dye is approached, the rates of additional dye imbibition and therefore further increase in the optical density of the filter layer progressively decline. This offers the advantage that an aim optical density of the filter layer can be reproducibly achieved without precisely controlling the duration of imbibition. It is preferred to saturate the filter layer with the dye, where "saturation" is defined as a dye concentration which produces an optical density that is increased by less than 5 percent when the duration of dye imbibition is doubled.

After one of the two layers to be positioned on the support is formed, the second filter layer can be formed by the same sequence of steps, differing only in the pattern or its location and the subtractive primary dye imbibed. Referring to FIGS. 2 and 4, the steps of forming the second layer on the support can also form the first of the superimposed layers. For example, by spin coating support 1 bearing only the filter layer M1 and the next applied coating composition or the support 5 bearing only the filter layer Y2 and the next applied coating composition, a uniform layer is formed overlying the first formed filter layer where it is present and directly contacting the support in remaining areas. By suitable choice of the exposing pattern, layers C1 and C2 in FIG. 2 or the layers C3 and C4 in FIG. 4 can be concurrently formed using the same coating composition. In each instance this results in two integrally joined additional filter layers, a second filter layer lying directly on the support and a first overlying filter layer. The final overlying filter layer can be formed by repeating the above sequence of steps, changing only the pattern of exposure and the subtractive primary dye employed.

In addition to the advantages noted above for saturation of the filter layers, it should be noted that saturation of a filter layer serves to inhibit imbibition of dye from a contiguous filter layer to a greater extent that when a lower concentration of dye is present. However, it should be noted that a filter layer though saturated with one subtractive primary dye can in some instances still accept a different dye. It should also be noted that when a filter layer initially containing no dye is patterned over another, dye containing filter layer, the overlying filter layer is susceptible to accepting dye by diffusion from the underlying filter layer. It is therefore preferred to construct the filter arrays of this invention so that the filter layers neither accept dye from or donate dye to an adjacent layer.

The patternable mordants of this invention significantly reduce dye migration between filter layers. Dye wandering can be further reduced by specific dye selections. Another option, compatible with the above approaches for minimizing wandering of subtractive primary dye noted above, is to locate a diffusion barrier on the surface of a filter layer after it is formed and before forming a contiguous filter layer. All of the above approaches are, of course, optional in that they need not be employed for applications which are not sensitive to some interface mixing of dyes from contiguous filter layers. Although use of any one effective approach is contemplated, superior results can be achieved generally by employing combinations of differing approaches.

The filter arrays according to the invention described above are in the form of separate elements useful in combination with known image sensors and image display devices. In alternate forms of the invention the filter arrays form integral components of the image sensors and image display devices.

Figure 6:
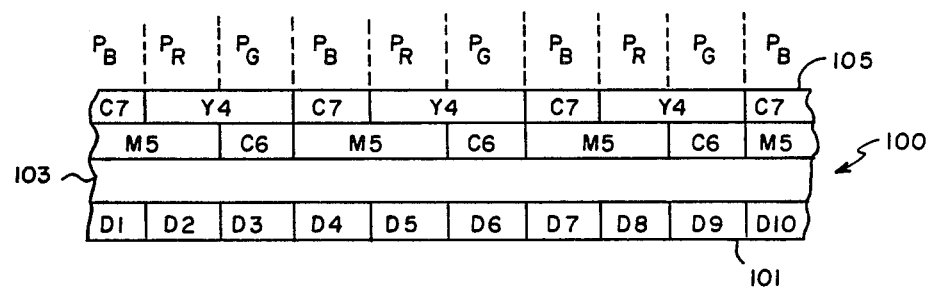
FIG. 6 is a schematic sectional view of a multicolor imaging device according to the invention.

One such alternate form of the invention is a device, of which the filter array is an integral part, for displaying multicolor images on a viewable surface. FIG. 6 is a schematic detail of such an integral multicolor image display device 100. A sectional view of a sequence of ten pixels is shown, including interlaid sets of green light transmitting pixels $P_G$, blue light transmitting pixels $P_B$, and red light transmitting pixels $P_R$. Light from the entire visible spectrum—e.g., white light—can be received at the lower surface 101 of the device. The light is first intercepted by an array of luminance modulators, indicated by D1, D2, D3, D4, D5, D6, D7, D8, D9, and D10, each occupying an area corresponding to one pixel. The luminance modulators are capable of selectively controlling the proportion of incident light which is transmitted. Their modulation range can extend from one extreme in which they are transparent—i.e., all incident light is transmitted—to a second extreme in which they are entirely opaque—i.e., no incident light is transmitted. In practice their modulation range can be much more limited. It is generally preferred that the luminance modulators have an optical density range of at least about 0.5, with an optical density range of at least 3.0 being preferred. The luminance modulators can be digital in nature, being capable of being switched only from one optical density extreme to the other. Alternatively, the luminance modulators can be selectively varied to any desired optical density between their extremes.

The luminance modulators vary the proportion of light transmitted in a controlled manner, but are not normally relied upon for chrominance discrimination. Chrominance discrimination in light transmission is the function of the filter layers, which are here shown for purposes of illustration as the filter layer pattern of FIG. 1. Since in this configuration the filters are coextensive with the pixel boundaries only in their widths, the luminance modulators are chosen to be coextensive with pixel boundaries. A transparent support 103 is shown interposed between the luminance modulators and the filter layers.

Functioning together the luminance modulators and the blue, green, and red filters formed by the filter layers permit white light received at the surface 101 to be transmitted as a multicolor image from the upper surface 105. The multicolor image can be projected onto a reflective surface, such as any conventional projection screen, for viewing. Alternately, the image can be viewed on the upper surface 105 of the device. The device works in essentially the same way if direction of light transmission through the device is reversed. Generally the pixels are made smaller than the unaided human eye can individually resolve, resulting in the sensation of differing hues in localized image areas.

To provide a specific example of a multicolor image display device, a panchromatically sensitized silver halide emulsion layer can be coated on support 103 to form a luminance modulator. While a continuous silver halide emulsion layer is limited in its ability to define precisely pixel boundaries, sharp pixel boundaries as well as pixel areas of less than $1 \times 10^{-8}$ m$^2$ can be realized by locating the emulsion layer in microcells.

To form a viewable multicolor image the silver halide emulsion layer of the device 100 is exposed imagewise through its upper surface 105. The filters allow only blue, green, or red light to reach the radiation sensitive silver halide in each microcell. For example, a blue filter transmits only blue light for exposure of the silver halide emulsion layer behind it. If the blue filter receives no light on exposure or only green and/or red light, no light is transmitted to the underlying emulsion layer. Thereafter the silver halide emulsion layer is developed to produce metallic silver imagewise in the microcells. The silver halide emulsion and development can be controlled so that nearly all or nearly none of the silver halide is reduced to metallic silver if light striking the microcell is above a threshold value or controlled so that metallic silver is formed as a direct or indirect function of the number of photons received during exposure. Direct positive silver halide emulsions produce metallic silver on development as an indirect function of light exposure while negative working silver halide emulsions produce metallic silver as a direct function of exposure. After development and fixing of any residual silver halide, white light incident upon the device 100 will produce a viewable multicolor image, which can be viewed by projection or directly on a device surface. Details of support, microcell, and silver halide emulsion composition and processing are disclosed by Blazey et al U.S. Pat. No. 4,307,165, Whitmore U.S. Pat. No. 4,387,146, and Gilmour et al U.S. Pat. No. 4,411,973, cited above. It is specifically contemplated that any other conventional luminance modulator can be substituted for the silver halide emulsion layer modulator disclosed.

Figure 7:
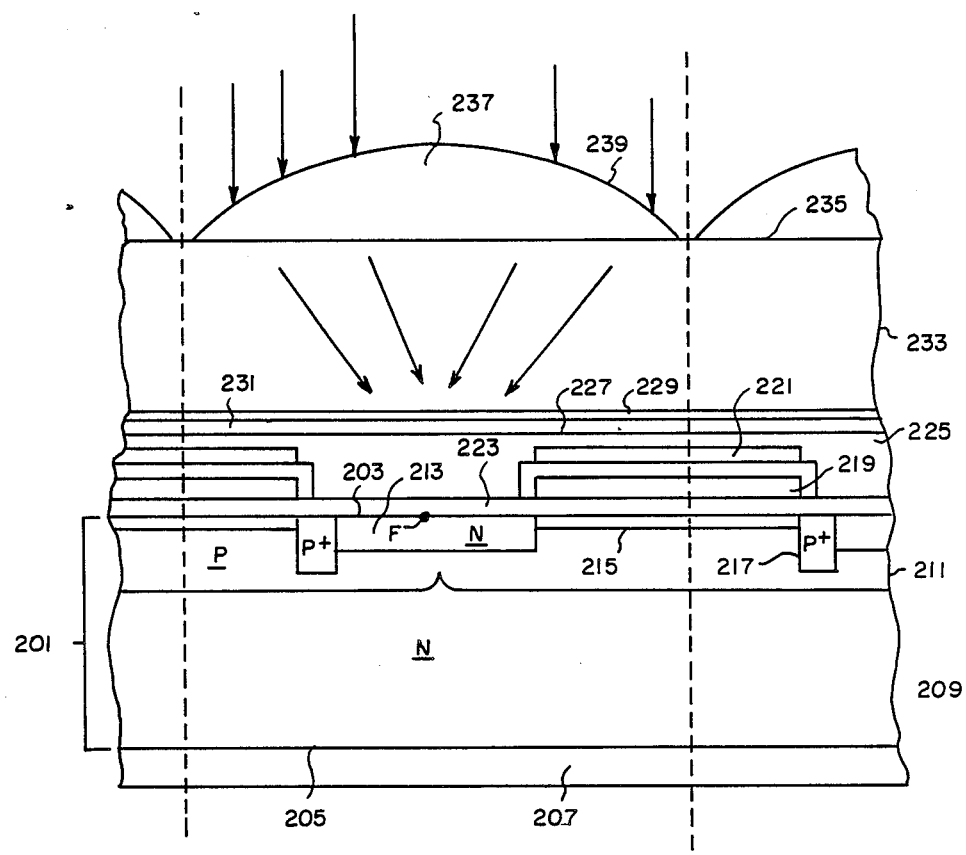
FIG. 7 is a sectional view of a single pixel of an interline charge coupled device employing a photodiode pixel sensor.

The integration of filters satisfying the invention into an image sensing device is also contemplated. Referring to FIG. 7 to illustrate the application of the invention to a preferred multipixel semiconductor device, a pixel, defined by parallel vertical dashed lines, of an interline charge coupled device (CCD) according to this invention is shown. A semiconductive substrate 201, typically a monocrystalline silicon substrate, is shown having an upper major surface 203 and a lower major surface 205. A conductive layer 207 covers the lower major surface. The semiconductive substrate has an N conductivity type region 209 and a P conductivity type well 211 formed by diffusion from the upper major surface 203. A photodiode is formed centrally in the pixel by N diffusion 213 from the upper major surface. The function of the photodiode is to supply electrons to the P well in proportion to the amount of light received on exposure.

The electrons are supplied to an adjacent charge coupled device. To create a buried channel for electron transfer a shallow N conductivity type region 215 is located adjacent the upper major surface. The buried channel thus formed extends from the photodiode to an adjacent CCD. To prevent unwanted lateral charge conduction, P+ conductivity type zones 217, referred to as channel stops, isolate the photodiode and the adjacent CCD from other adjacent surface structures.

A gate electrode 219, typically formed of polycrystalline silicon, is shown overlying the upper surface of the semiconductive substrate. Since polycrystalline silicon is transparent, a light shield 221, typically formed of aluminum, overlies the gate electrode. A transparent insulator 223 is shown overlying the entire upper major surface of the semiconductive substrate and also separating the gate electrodes from the light shields. Typically the insulator is silicon dioxide, with a surface laydown of passivant, such as borosilicate glass, being common. Although shown as a unit, the insulator is typically formed in several successive fabrication steps. A transparent insulative layer 225, commonly referred to as a planarizing layer, is positioned to provide a smoothed surface 227, shown as a planar surface, although in practice the surface can be non-planar. On this surface is positioned a filter array consisting of within the pixel boundaries superimposed filter layers 229 and 231. The filter array can be comprised of any one of the various orthogonal patterns previously described.

A relatively thick lens supporting layer 233 overlies the filter and presents an upper surface 235. A pixel lens element 237 is positioned on the upper surface of the support layer. The lens element is spaced inwardly from the boundaries of the pixel and hence is laterally spaced from lens elements of all adjacent pixels. The lens surface 239 can be semicylindrical, if desired, but is preferably hemispherical. In the optimum form of the invention the supporting layer surface 235 within the pixel boundaries is polygonal, and the lens edges are parallel to and spaced just inwardly of the pixel boundaries. This results in a pillow shaped lens.

Light striking the lens surface 239, indicated by vertical arrows, is bent inwardly, as indicated by the converging arrows in supporting layer 233. The light is shown directed to the focal spot F on the surface of the photodiode.

It should be noted that the inward directing of light from the lenses to the photodiode causes light to be received by only the central portion of the filter. Thus, the lens constructions allows edge alignments of the pixel boundaries and the filter elements to be relaxed without incurring an optical penalty.

While only one pixel of the exemplary semiconductor device is shown in FIG. 7, it is appreciated that actual devices typically contain very large numbers of essentially similar pixels, actual numbers ranging in the $10^3$ to $10^6$ orders of magnitude, depending on the application being served. While the invention has been described in terms of directing light to a photodiode, it is appreciated that many CCD's are constructed for directly sensing light and that for such applications each CCD sensor occupies a central pixel location. The lens construction, while capable of increasing light sensing efficiency, is not required for either photodiode or CCD sensors.

A variety of alternative semiconductor image sensor constructions compatible with the filters of this invention are known in the art. Bayer U.S. Pat. No. 3,971,065 particularly illustrates the relationship of filter constructions to image sensing. Murakoshi U.S. Pat. No. 4,455,575 illustrates sensors employing photodiodes in combination with CCD's. Ishihara U.S. Pat. No. 4,322,753 illustrates P well constructions for image sensors. Weiss U.S. Ser. No. 853,330, filed Apr. 18, 1986, titled LIGHT SENSING DEVICES WITH LENTICULAR PIXELS, commonly assigned, now U.S. Pat. No. 4,694,185, discloses details of preferred lens constructions.

The invention can be better appreciated by reference to the following specific examples:

PREPARATION 1

Preparation of 2-N,N-dimethylaminoethyl cinnamate

To a mechanically stirred solution of 2-N,N-dimethylaminoethanol 9.0 g (0.10 mol) in 100 ml of methylene chloride cooled to 0° C. under argon was added, dropwise, 16.7 g (0.10 mol) of freshly distilled cinnamoyl chloride in 100 ml of methylene chloride. The reaction mixture was stirred at room temperature overnight, the solvent was evaporated, and the residual solid was dissolved in 100 ml of water. This solution was treated with 1 equivalent of 1N sodium hydroxide solution, and the liberated amine was extracted into 3×150 ml portions of ether. The combined ether portions were washed with water and then with saturated sodium chloride solution, dried over sodium sulfate, filtered, and the solvent was evaporated. The residual oil was distilled through a 3 inch Vegreux ™ column at 180° C/1.5 mm Hg to give 19.4 g (88.5%) of the desired material which exhibited the following properties: mass spectrum, m/e $M^{30}=219$; $^1H$ nmr ($\delta$, CDCl$_3$) 2.32 (s, 6H, N—CH$_3$), 2.14 (t, 2H, CH$_2$—N), 4.31 (t, 2H, CH$_2$—O), 6.45 (d, 1H, J=16 Hz, vinyl =CH—C(=O)), 7.20 (d, 1H, J=16 Hz, vinyl =CH—aryl), 7.36 (m, 3H, aromatic) and 7.51 ppm (m, 2H, aromatic; $^{13}C$ nmr ($\delta$, CDCl$_3$) 166.3 (C=O), 144.3 (vinyl =CH—aryl) 133.9 (aromatic C-1), 129.7 (aromatic C-4), 128.4 and 127.6 (aromatic C-2, C-6 and C-3, C-5), 117.6 (vinyl =CH=CO), 61.7 ( )—CH$_2$), 57.4 (N—CH$_2$), and 45.2 ppm (N—CH$_3$). Anal. calc'd. for C$_{13}$H$_{17}$NO$_2$: C, 71.2; H, 7.8; N, 6.4 Found: C, 71.4; H, 7.8; N, 6.2

PREPARATION 2

Preparation of 3-N,N-dimethylaminopropyl cinnamate

This material was prepared in a fashion analogous to that used in preparation 1 to give 88.3% yield of an oil which exhibited the following properties: b.p. 142° C./0.1 mm Hg; mass spectrum, m/e $M^+=233$; $^1H$ nmr ($\delta$, CDCl$_3$) 7.63 (d, 1H, J=16 Hz, vinyl =CH—aryl), 7.46 (m, 2H, aromatic), 7.32 (m, 3H, aromatic), 6.41 (d, 1H, J=16 Hz, vinyl =CH—C(=O)), 4.35 (t, 2H, CH$_2$—O), 2.24 (t 2H, CH$_2$—N, 2.20 (s, 6H, CH$_3$—N), and 1.90 ppm (m, 2H, CH$_2$—CH$_2$—CH$_2$); $^{13}C$ nmr ($\delta$, CDCl$_3$) 166.8 (C=O), 144.6 (=CH—aryl), 134.4 (aromatic C-1), 130.2 (aromatic C-2), 128.8 and 128.0 (aromatic C-2, C-6, and C-3, C-5), 118.1 (vinyl =CH—CO), 62.8 (CH$_2$—O), 56.1 (CH$_2$—N), 45.3 (CH$_3$—N), and 27.0 ppm (C—CH$_2$—C). Anal. calc'd. for C$_{14}$H$_{19}$NO$_2$: C, 72.1; H, 8.2; N, 6.0 Found: C, 72.0; H, 8.2; N, 5.8

PREPARATION 3

Preparation of 2-N,N-dimethylaminoethyl 3-(2-thienyl)-2-propenoate

This material was prepared in a fashion analogous to that used in preparation 1 to give 91.2% yield of an oil which exhibited the following properties: b.p. 140° C./0.1 mm Hg; $^1H$ nmr ($\delta$, CDCl$_3$) 7.76 (d, 1H, J=16 Hz, acrylate vinyl =CH—thienyl), 7.34 and 7.23 (pair of d's, 2H, thienyl H-3 and H-5), 7.04 (m, 1H, thienyl H-4), 6.26 (d, 1H, J=16 Hz, acrylate =CH—C=O), 4.27 (t, 2H, CH$_2$—O), 2.13 (t, CH$_2$—N) and 2.30 ppm (s, 6H, CH$_3$—N); $^{13}C$ nmr ($\delta$, CDCl$_3$) 166.3 (C=O), 139.2 (thienyl C-2), 136.9 (vinyl =CH—thienyl), 130.5 (thienyl C-5), 128.1 and 127.7 (thienyl C-3 and C-4), 116.7 (vinyl —C—C—C=O), 61.8 (CH$_2$—O), 57.6 (CH$_2$—N), and 45.4 ppm (CH$_3$—N). Anal. calc'd. for C$_{11}$H$_{15}$NO$_2$S: C, 58.6; H, 6.2; N, 14.2 Found: C, 58.4; H, 6.9; N, 14.5

PREPARATION 4

Preparation of 2-N,N-dimethylaminoethyl 3-(2-furyl)-2-propenoate

This material was prepared in a fashion similar to that used in preparation 1 to give 88% yield of an oil with the following properties: b.p. 128° C./0.25 mm Hg; mass spectrum m/e $M^+=209$; $^1H$ nmr ($\delta$, CDCl$_3$) 7.46 (d, 1H, furanyl H-5), 7.41 (d, 1H, J=16 Hz, vinyl =CH—furanyl), 6.60 (d, 1H, furanyl H-3), 6.45 (m, 1H, furanyl H-4), 6.35 (d, 1H, J=16 Hz, vinyl =CH—C=O), 4.28 (t, 2H, CH$_2$—O), 2.64 (t, 2H, CH$_2$—N), and 2.33 ppm (s, 6H, CH$_3$—N); $^{13}C$ nmr ($\delta$, CDCl$_3$) 166.3 (C=O), 150.4 (furanyl C-2, 144.3 (furanyl C-5, 130.7 (vinyl =CH—furanyl), 115.3 and 114.2 (furanyl C-3 and vinyl =CH—C=O), 111.8 (furanyl C-4), 61.8 (CH$_2$—O), 57.4 (CH$_2$—N), and 45.3 ppm (CH₃—N). Anal. calc'd. for $C_{11}H_{15}NO_3$: C, 63.1; H, 7.2; N, 6.7 Found: C, 63.2; H, 7.2; N, 6.1

PREPARATION 5

Preparation of 3-N,N-dimethylaminopropyl 3-(2-furyl)-2-propenoate

This material was prepared in a fashion similar to that used in preparation 1 to give 86.8% yield of an oil with the following properties: b.p. 120° C./0.15 mm Hg; mass spectrum m/e M+ =223; ¹H nmr (δ, CDCl₃) 7.48 (d, 1H, furanyl H-5), 7.42 (d, 1H, J=16 Hz, vinyl =CH—furanyl), 6.59 (d, 1H, furanyl H-3), 6.43 (m, 1H, furanyl H-4), 6.28 (d, 1H, J=16 Hz, vinyl =CH—C=O), 4.22 (t, 2H, CH₂—O), 2.36 (t, 2H, CH₂—N), 2.22 (s, tH, CH₃—N), and 1.84 ppm (m, 2H, C—CH₂—C); ¹³C nmr (δ, CDCl₃) 166.4 (C=O), 150.5 (furanyl C-2), 144.3 (furanyl C-5), 130.6 (vinyl =CH—furanyl), 115.5 (vinyl =CH—C=O), 114.3 (furanyl C-3, 111.9 (furanyl C-4), 62.4 (CH₂—O), 55.8 (CH₂—N), 45.1 (CH₃—N) and 26.7 ppm (C—CH₂—C). Anal. calc'd. for $C_{12}H_{17}NO_3$: C, 64.6; H, 7.7; N, 6.3 Found: C, 64.5; H, 7.4; N, 5.5

PREPARATION 6

Preparation of 3-N,N-dimethylaminopropyl cinnamide

To a mechanically stirred, ice-cooled solution of 62 g (0.60 mol) of 3-N,N-dimethylpropylamine in 200 ml of methylene chloride was added a solution of cinnamoyl chloride (100 g, 0.60 mol) in 200 ml of methylene chloride over one hour. The reaction mixture was allowed to stir at room temperature overnight, then was cooled in an ice-bath and treated with a slight excess of 1N NaOH solution. The methylene chloride solution was then washed with water and saturated sodium chloride solution, dried with sodium sulfate, and the solvent was evaporated to leave an oil which was vacuum distilled at 205° C./1.0 mm Hg to give a 68.9% yield of the desired product. This material exhibited the following properties: mass spectrum, m/e M+ =232; ¹H nmr (δ, CDCl₃) 7.57 (d, 1H, J=16 Hz, vinyl =CH—aryl), 7.48 (m, 2H, aromatic), 7.33 (m, 3H, aromatic), 7.21 (s, 1H, exchanged with D₂O, —C(=O)—NH—), 6.34 d, 1H, J=16 Hz, vinyl =CH—CO), 3.48 (m, 2H, =CH₂—N-H—C=O), 2.40 (t, 2H, CH₂—N), 2.24 (s, 6H, CH₃—N), and 1.71 ppm (m, 2H, C—CH₂—C); ¹³C nmr (δ, CDCl₃) 165.8 (C=O), 140.0 (vinyl =CH—aryl), 134.9 (aromatic C-1), 129.3 (aromatic C-4), 128.6 and 127.5 (aromatic C-2, C-6m and C-3, C-5), 121.4 (vinyl =CH—C=O), 58.5 (CH₂—N), 45.3 (CH₃—N), 39.4 (CH₂—NH—C=O), and 26.1 ppm (C—CH2—C). Anal. calc'd. for $C_{14}H_{20}NO_3O$: C, 72.4; H, 8.7; N, 12.1 Found: C, 72.1; H, 8.7; N, 12.1

PREPARATION 7

Preparation of poly(chloromethylstyrene)

A mechanically stirred solution of 953.9 g (6.25 mol) of freshly distilled chloromethylstyrene as a 60/40 mixture of meta and para isomers in 954 g of toluene containing 5.13 g (0.03125 mol) of 2,2'-azobis(2-methylpropionitrile) was deoxygenated by nitrogen ebullition for 45 minutes, then heated to 60° C. for 15 hours, cooled to ambient temperature, and diluted with 700 ml of tetrahydrofuran. The polymer was precipitated into 18 l of methanol, isolated by filtration, triturated for one hour with 2 l of methanol, filtered, washed with additional methanol, and dried in a Buchner funnel by sucking air through it for 24 Hours. Yield: 601 g (63%) of a white powder. Gel permeation chromatographying tetrahydrofuran using a micro-styrogel 10⁶ to 10³ porosity column indicated a dispersity of 2.79; Mn=26×10³; Mw=74×10³; mz=143×10³ when referenced to polystyrene. Anal. calc'd. for $C_9H_9Cl$: C, 70.8; H, 5.9; N, 23.2 Found: C, 71.0; H, 6.0; N, 23.3

PREPARATION 8

Preparation of poly-[N-(2-cinnamatoethyl)-N,N-dimethyl-N-vinyl benzyl ammonium chloride-co-N-(3-hydroxypropyl)-N,N-dimethyl-N-vinyl benzyl ammonium chloride (60/40 molar ratio)](Compound 11)

In a 100 ml hypovial a solution of 11.49 g (0.0753 equivalents) of poly(chloromethylstyrene) from preparation 7 in 35 ml of dimethylformamide (DMF) was treated with a solution 9.91 g (0.0452 equivalents) of 3-N,N-dimethylaminopropyl cinnamate from preparation 1 in 10 ml of DMF. The reaction mixture was ebullated with argon for 5 minutes, and the vial was then stoppered and sealed with a silicone rubber stopper and aluminum crimp cap, placed in a constant temperature bath at 60° C. and rotated axially at a 30° angle for 100 minutes. The vial was then cooled to ambient temperature in a water bath, opened, and the reaction mixture was treated with swirling with a solution of 3.48 g (0.0336 equivalents) of 3-N,N-dimethylaminopropanol in 7 ml of methanol. The vial was again stoppered and sealed, shaken to ensure a homogeneous distribution of reagents, and again rotated at 60° C. for 2 hours. The vial was then cooled to ambient temperature, opened, and the reaction mixture was diluted to 250 ml with methanol. The polymer was precipitated into 3 l of ethyl acetate, isolated by filtration, triturated with 1.1 of ethyl acetate, filtered, washed with ethyl acetate, and dried in a Buchner filter funnel by sucking air through it for 24 hours. Yield: 26 g. Anal. calc'd. for $C_{94}H_{122}CL_5N_5O_8$: C, 69.4; H, 7.6; N, 4.3; Cl, 10.9 Found: C, 69.1; H, 7.5; N, 4.2; Cl, 11.1

Some additional patternable mordants that are part of this invention are listed in Table III and corresponding combustion analysis results are listed in Table IV. The polymers were prepared according to the fashion described in Preparation 8 with appropriate adjustments made to allow for changes in the respective molecular weights and molar ratios of the amines used. Compositions of the patternable mordants that satisfy the goals and advantages of this invention are not limited to those included in these tables.

TABLE III

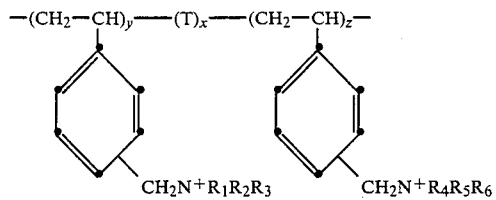

$$-(CH_2-CH)_y-(T)_x-(CH_2-CH)_z-$$

with phenyl groups bearing $CH_2N^+R_1R_2R_3$ and $CH_2N^+R_4R_5R_6$

| Compound | y | z | R₁ | R₂ | R₃ | R₄ | R₅ | R₆ |
|---|---|---|---|---|---|---|---|---|
| 1 | 60 | 40 | A | M | M | M | M | M |
| 2 | 100 | 0 | A | M | M | — | — | — |
| 3 | 70 | 30 | A | M | M | M | M | M |
| 4 | 60 | 40 | A | M | M | G | M | M |
| 5 | 40 | 60 | A | M | M | G | M | M |
| 6 | 60 | 40 | A | M | M | I | M | M |
| 7 | 50 | 50 | A | M | M | H | M | M |
| 8 | 40 | 60 | A | M | M | H | M | M |
| 9 | 30 | 70 | A | M | M | H | M | M |
| 10 | 20 | 80 | A | M | M | H | M | M |
| 11* | 60 | 40 | A | M | M | H | M | M |
| 12 | 60 | 40 | A | M | M | L | M | M |
| 13 | 50 | 50 | A | M | M | M | M | M |
| 14 | 50 | 50 | A | M | M | K | M | M |
| 15 | 60 | 40 | A | M | M | J | J | J |
| 16 | 100 | 0 | C | M | M | — | — | — |
| 17 | 90 | 10 | C | M | M | M | M | M |
| 18 | 80 | 20 | C | M | M | M | M | M |
| 19 | 70 | 30 | C | M | M | M | M | M |
| 20 | 60 | 40 | C | M | M | M | M | M |
| 21 | 50 | 50 | C | M | M | I | I | I |
| 22 | 90 | 10 | C | M | M | O | M | M |
| 23 | 80 | 20 | C | M | M | O | M | M |
| 24 | 70 | 30 | C | M | M | O | M | M |
| 25 | 50 | 40 | C | M | M | O | M | M |
| 26 | 90 | 10 | C | M | M | K | M | M |
| 27 | 80 | 20 | C | M | M | K | M | M |
| 28 | 70 | 30 | C | M | M | K | M | M |
| 29 | 60 | 40 | C | M | M | K | M | M |
| 30 | 50 | 50 | C | M | M | K | M | M |
| 31 | 60 | 40 | C | M | M | I | M | M |
| 32 | 60 | 40 | B | M | M | M | M | M |
| 33 | 60 | 40 | B | M | M | I | M | M |
| 34 | 60 | 40 | B | M | M | H | M | M |
| 35 | 60 | 40 | B | M | M | H | M | M |
| 36 | 60 | 40 | B | M | M | O | M | M |
| 37 | 60 | 40 | B | M | M | N | M | M |
| 38 | 60 | 40 | D | M | M | M | M | M |
| 39 | 60 | 40 | F | M | M | M | M | M |
| 40 | 60 | 40 | E | M | M | — | — | — |
| 41[bf] | 41 | 27 | A | M | M | M | M | M |
| 42[cd] | 50 | 30 | C | M | M | K | M | M |
| 43[ce] | 40 | 30 | C | M | M | K | M | M |
| 44[gh] | 40 | 30 | A | M | M | H | M | M |
| 45 | 60 | 40 | P | M | M | H | M | M |
| 46 | 60 | 40 | F | M | M | H | M | M |

*Preparation 8

Footnotes to Table III:
[a]Substituents:

A —CH₂CH₂O—CO—CH=CH—C₆H₅
B —CH₂CH₂CH₂O—CO—CH=CH—C₆H₅
C —CH₂CH₂CH₂NH—CO—CH=CH—C₆H₅

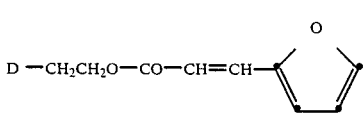

D —CH₂CH₂O—CO—CH=CH—(furyl, O)

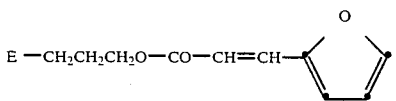

E —CH₂CH₂CH₂O—CO—CH=CH—(furyl, O)

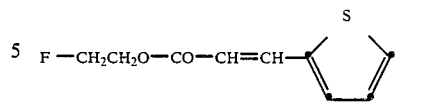

F —CH₂CH₂O—CO—CH=CH—(thienyl, S)

G —CH₂CH=CH₂
H —CH₂CH₂CH₂OH
I —CH₂CH₂OH
J —CH₂CH₃
K —C₆H₁₁
L —CH₂CH(OH)CH₂OH
M —CH₃
N —CH₂C₆H₅

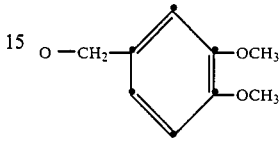

O —CH₂—(C₆H₃)(OCH₃)₂

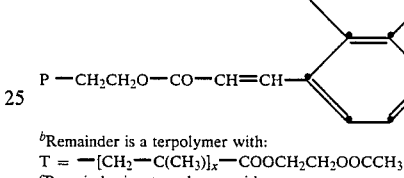

P —CH₂CH₂O—CO—CH=CH—(naphthyl)

[b]Remainder is a terpolymer with:
$T = -[CH_2-C(CH_3)]_x-COOCH_2CH_2OOCCH_3$

[c]Remainder is a terpolymer with:
$T = -(CH-CH_2)_x-C_6H_4CH_2N[CH_2CH_2OH]_3^+ \ Cl^{\ominus}$

[d]"x" = 20 mol %
[e]"x" = 30 mol %
[f]"x" = 32 mol %

[g]Remainder is a terpolymer with:
$T = -[CH_2CH]_x-C_6H_4-CH_2N[CH_2CH=CH_2](CH_3)_3^+ \ Cl^{\ominus}$

[h]"x" = 25 mol %

TABLE IV

Combustion Analyses of Patternable Mordants Listed in Table III

| Compound | Calculated | | | | Found | | | |
|---|---|---|---|---|---|---|---|---|
| | C | H | N | Cl | C | H | N | Cl |
| 1.a | 70.1 | 7.5 | 3.5 | 11.5 | 70.1 | 7.6 | 4.6 | 11.8 |
| 2 | 71.1 | 7.0 | 3.8 | 9.5 | 70.6 | 6.9 | 3.5 | 7.3 |
| 3 | — | — | — | — | — | — | — | — |
| 4 | 71.0 | 7.5 | 4.4 | 11.1 | 71.0 | 7.4 | 4.2 | 11.2 |
| 5 | 70.2 | 7.8 | 4.6 | 12.2 | 70.2 | 7.8 | 3.5 | 12.0 |
| 6 | 69.1 | 7.4 | 4.4 | 11.1 | 69.3 | 7.9 | 4.5 | 11.4 |
| 7 | 68.9 | 7.7 | 4.5 | 11.3 | 66.4 | 7.7 | 4.4 | 11.1 |
| 8 | 68.4 | 7.9 | 4.6 | 11.7 | 64.2 | 7.9 | 4.3 | 11.5 |
| 9 | 67.8 | 8.0 | 4.8 | 12.2 | 66.4 | 7.6 | 4.6 | 11.8 |
| 10 | 67.2 | 8.2 | 5.0 | 12.7 | 64.3 | 7.7 | 4.7 | 12.3 |
| 11 | 69.4 | 7.6 | 4.3 | 10.9 | 69.1 | 7.6 | 4.2 | 11.1 |
| 12 | 68.0 | 7.4 | 4.2 | 10.7 | 67.3 | 7.6 | 4.1 | 11.1 |
| 13 | 70.0 | 7.6 | 4.8 | 12.1 | 69.2 | 7.8 | 4.9 | 12.5 |
| 14 | 71.9 | 8.0 | 4.3 | 10.9 | 68.0 | 7.4 | 3.7 | 9.7 |
| 15 | 71.0 | 7.8 | 4.3 | 10.9 | 70.9 | 7.7 | 4.0 | 10.8 |
| 16 | 71.8 | 7.6 | 7.3 | 9.2 | 69.4 | 7.7 | 6.9 | 9.0 |
| 17 | 71.6 | 7.7 | 7.2 | 9.6 | 69.0 | 7.5 | 6.9 | 8.3 |
| 18 | 71.3 | 7.7 | 7.2 | 10.1 | 66.2 | 7.2 | 6.5 | 8.3 |
| 19 | 71.1 | 7.8 | 7.2 | 10.6 | 68.5 | 7.6 | 6.7 | 9.5 |
| 20 | 70.8 | 7.9 | 7.1 | 11.2 | 67.9 | 7.5 | 6.5 | 8.9 |
| 21 | 66.5 | 7.8 | 6.1 | 10.3 | 67.0 | 7.7 | 5.6 | 10.0 |
| 22 | 71.5 | 7.6 | 7.0 | 9.3 | 67.4 | 7.2 | 6.5 | 8.0 |
| 23 | 71.3 | 7.6 | 6.7 | 9.4 | 69.9 | 7.5 | 6.5 | 8.2 |
| 24 | 71.0 | 7.6 | 6.4 | 9.5 | 69.6 | 7.4 | 6.1 | 9.1 |
| 25 | 70.7 | 7.6 | 6.1 | 9.6 | 69.4 | 7.4 | 5.9 | 8.6 |
| 26 | 71.9 | 7.7 | 7.1 | 9.5 | 64.3 | 7.5 | 6.1 | 8.3 |
| 27 | 71.9 | 7.9 | 6.9 | 9.7 | 71.0 | 7.7 | 6.8 | 7.3 |
| 28 | 72.0 | 8.0 | 6.7 | 10.0 | 69.3 | 7.8 | 6.4 | 8.3 |
| 29 | 72.2 | 8.2 | 6.5 | 10.3 | 71.2 | 7.9 | 6.4 | 8.4 |
| 30 | 72.3 | 8.3 | 6.3 | 10.7 | 66.6 | 7.8 | 5.7 | 10.3 |
| 31 | 69.6 | 7.8 | 6.8 | 10.8 | 68.6 | 8.0 | 6.6 | 11.4 |

EXAMPLE 1

Two Micrometer Line Width Filters

A mordant formulation was prepared by dissolving 3.04 g poly-[N-(2-cinnamidoethyl)-N,N-dimethyl-N-(4-vinylbenzyl)ammonium chloride](Compound 16) and 0.09 g of sensitizer S1, 5,7-di-N-propoxy-3-(4-cyanobenzoyl)coumarin in 20 ml of 2-ethoxy ethanol. The resulting solution was allowed to warm and roll overnight. The solution was filtered to 0.45 $\mu$m. Spin coating on SiO$_2$ at 2000 rpm produced a 1.11 $\mu$m film (refractive index=1.60). The coating was baked at 100° C. for 30 min in a convection oven.

Masked contact exposure was performed in an Oriel TM exposure system using a 200 W high pressure Hg lamp that emits approximately equal peak intensities at 365, 405, and 436 nm radiation, with a total integrated intensity of 10 to 15 mW/cm$^2$. Exposures of 7–25 sec. all gave images which were readily developed in 19:1 volume ratio of water to acetone over 60 sec. Filter elements of 2 $\mu$m line widths were obtained exhibiting little distortion.

EXAMPLE 2

Evaluation of resolution and photospeed for poly-[N-(3-cinnamidopropyl)-N,N-dimethyl-N-vinyl benzyl ammonium chloride-co-N,N,N-trimethyl-N-vinyl benzyl ammonium chloride] (90:10 molar ratio) (Compound 17)

Into a 30 ml brown bottle was weighed the following; 116 mg of sensitizer S2, 3-(7-methoxy-3-coumarinoyl)-1-methylpyridinium p-toluenesufonate, 2.555 g of Compound 17, 5 g of n-propanol and 10 g of distilled water to give a 15.1% solids solution. The bottle was tumbled until a clear solution was affected. The solution was then filtered through a Millex ® HA filter membrane (0.45 $\mu$m) utilizing a syringe. The filtered solution was coated onto 5 cm×5 cm quartz plates as well as 5 cm diameter silicon wafers having an 8000Å thick surface layer of SiO$_2$. The coatings were made at 1000 rpm on a Headway ® spin coater. The coatings were then dried at 100° C. for 15 min. in a convection oven. Coating thicknesses were measured and found to be 0.83±0.09 $\mu$m. Absorption curves were obtained with the coatings on quartz which showed an absorbance due to the sensitizer of 0.3 optical density units for a 1 $\mu$m thick coating.

The coatings were exposed through a resolution target-step tablet combination using an Oriel TM Model 8089 photoresist illumination head. The coatings were developed with a 3:1 molar ratio of n-propanol to n-butanol for 30 sec at 22° C. The developed coatings were dried at 100° C., 15 minutes as above. The thicknesses of the remaining images were measured at each exposure level. The resulting data was plotted as normalized thickness vs. log of exposure. A "speed" value was derived from these plots by taking the exposure value necessary to give 50% of the normalized thickness (Dg$^{\frac{1}{2}}$=24.0 mJ/cm$^2$). That is, an exposure necessary to leave half of the original thickness of the patternable mordant layer after development consisted of 24.0 mJ/cm$^2$. Micrographs of the images were also obtained which showed good filter element resolution down to 3 $\mu$m lines and spaces.

EXAMPLE 3

Evaluation of the photospeed of poly-[N-(2-cinnamatoethyl)-N,N-dimethyl-N-vinyl benzyl ammonium chloride-co-N-(3-hydroxypropyl)-N,N-dimethyl-N-vinyl benzyl ammonium chloride] (60:40 molar ratio) (Compound 11)

Same as Example 2, except for the following changes: Compound 11 was substituted for Compound 17. Coating solution solids were 12.1% in water, and coatings were made at 2000 rpm. Coating thicknesses obtained were 1.13±0.008 $\mu$m. Developer formulation consisted of a 4:1 molar ratio of n-propanol to n-butanol and Dg$^{\frac{1}{2}}$=7.9 mJ/cm$^2$.

EXAMPLE 4

Evaluation of the photospeed of poly-[N-(3-cinnamidopropyl)-N,N-dimethyl-N-vinyl benzyl ammonium chloride-co-N-(3,4-dimethoxy phenyl)-N,N-dimethyl-N-vinyl benzyl ammonium chloride] (90:10 molar ratio) (Compound 22)

Same as Example 2, except for the following changes: Compound 22 was substituted for Compound 17. Coating solution solids were 15.7% in a 4:1 volume ratio of N,N-dimethyl formamide to water. Coating thicknesses were 0.97±0.04 $\mu$m and developer was a 1:19 molar ratio of ethanol to n-propanol. Dg$^{\frac{1}{2}}$=19.5 mJ/cm$^2$.

EXAMPLE 5

Evaluation of the photospeed of poly-[N-(2-cinnamatoethyl)-N,N-dimethyl-N-vinyl benzyl ammonium chloride-co-N-(2-propenyl)-N,N-dimethyl-N-vinyl benzyl ammonium chloride] (40:60 molar ratio) (Compound 5)

Same as Example 2, except for the following changes: Compound 5 was substituted for Compound 17. The coating solution solids were 12.9% in water. Coating at 2000 rpm gave 1.01±0.07 $\mu$m coatings. The coatings were developed with a 4:1 molar ratio n-butanol to n-pentanol. Dg$^{\frac{1}{2}}$=14.2 mJ/cm$^2$.

EXAMPLE 6

Evaluation of the photospeed of poly-[N-(2-cinnamatoethyl)-N,N-dimethyl-N-vinyl benzyl ammonium chloride-co-N-(3-hydroxylpropyl)-N,N-dimethyl-vinyl benzyl ammonium chloride-co-N-(3-prop-2-ene)-N,N-dimethyl-N-vinyl benzyl ammonium chloride] (50:25:25 molar ratio) (Compound 44)

Same as Example 2, except for the following changes: Compound 44 was substituted for Compound 17. Coating solution solids were 13.9% in water. Coating at 2000 rpm gave 1.20±0.10 $\mu$m thick coatings. The coatings were developed with 2:3 molar ratio of n-propanol to n-butanol. Dg$^{\frac{1}{2}}$=14.2 mJ/cm$^2$.

EXAMPLE 7

Evaluation of the photospeed of poly-[N-(2'-ethyl-3-(α-naphthyl)propenoate)-N,N-dimethyl-N-vinyl benzyl ammonium chloride-co-N-(3-hydroxypropyl)-N,N-dimethyl-N-vinyl benzyl ammonium chloride] (60:40 molar ratio) (Compound 45)

Same as Example 2, except for the following changes: Compound 45 was substituted for Compound 17. Coating solution solids were 12.9% in water. Coating at 2000 rpm gave 0.94±0.10 μm thick coatings. The coatings were developed with n-propanol. $Dg^{\frac{1}{2}}=4.0$ mJ/cm$^2$.

EXAMPLE 8

Evaluation of the photospeed of poly-[N-(2'-ethyl-3-(2-thiofuranyl)propenoate)-N,N-dimethyl-N-vinyl benzyl ammonium chloride-co-N-(3-hydroxypropyl)-N,N-dimethyl-N-vinyl benzyl ammonium chloride] (60:40 molar ratio) (Compound 46)

Same as Example 2, except for the following changes: Compound 46 was substituted for Compound 17. Coating solution solids were 14.9% solids in water. Coating at 2000 rpm gave 1.13±0.02 μm thick coatings. The coatings were developed with a 1:4 molar ratio of ethanol to n-propanol. $Dg^{\frac{1}{2}}=4.0$ mJ/cm$^2$.

EXAMPLE 9

Evaluation of the photospeed of poly-[N-(2-cinnamatoethyl)-N,N-dimethyl-N-vinyl benzyl ammonium chloride-co-N,N,N-trimethyl-N-vinylbenzyl ammonium chloride (Compound 1) and residual density of sensitizer S2

Same as Example 2, except for the following changes: Compound 1 was substituted for Compound 17. Coating solution solids were 13.7 percent by weight in water, and 5.5 percent sensitizer, based on total polymer, were employed. Coating at 2000 rpm on silicon gave a 1.11±0.04 μm thick coating. The coating was developed with a 1:2 molar ratio of methanol to isobutanol. $Dg^{\frac{1}{2}}=14.8$ mJ/cm$^2$. The absorption spectrum of a coating on a quartz plate showed an optical density of 0.3 attributable to the sensitizer for a 1 μm thick coating. The coating was flood exposed to 75 mJ/cm$^2$ of radiation and developed for 30 seconds. The subsequent measurement of optical density of the remaining film showed no absorption due to the sensitizer. Absorption of the patterned mordant layer was less than 0.01 optical density unit from 360 to 700 nm.

EXAMPLE 10

Polymer in Example 9 with varied sensitizer S3

Same as Example 9, except for the following changes: Sensitizer S3, 3-(benzo[f]coumaroyl)-1-methylpyridinium p-toluenesulfonate, was substituted for sensitizer S2 in the coating solution in a concentration of 8.5 weight percent sensitizer based on total polymer and gave an optical density of 0.3 for a 1 μm thick coating before development. $Dg^{\frac{1}{2}}=20.9$ mJ/cm$^2$.

EXAMPLE 11

Polymer in Example 9 with varied sensitizer S4

Same as Example 9, except for the following changes: Sensitizer S4, 3-(5,7-dimethoxy-3-coumarinoyl)-1-methylpyridinium p-toluenesulfonate, was substituted for sensitizer S2 in the coating solution in a concentration of 6.2 weight percent sensitizer based on total polymer. $Dg^{\frac{1}{2}}=19.1$ mJ/cm$^2$.

EXAMPLE 12

Polymer in Example 9 with varied sensitizer S5

Same as Example 9, except for the following changes: Sensitizer S5, 4-(5,7-dimethoxy-3-coumarinoyl)-1-methyl pyridinium p-toluenesulfonate, was substituted for sensitizer S2 in a concentration of 8.0 weight percent sensitizer based on total polymer, and the coating solution contained total solids of 12.8 percent by weight in water. When coated the solution gave a 0.8 μm coating thickness. The coating was exposed to 200 mJ/cm$^2$ of 405 nm radiation using a Perkin-Elmer SRA 200 Censor ® stepper. Acceptable images were obtained after development with a 1:2 molar ratio of methanol to isobutanol.

EXAMPLE 13

Evaluation of dye imbibition of Compound 1

A solution containing Compound 1, 10.9 percent by weight solids in water and 8.0 percent by weight S2 based on total polymer was spin coated on a glass wafer at 5000 rpm, contact exposed for 5 seconds using a Canon ® PLA501F aligner, developed for 30 seconds with a 1:2 molar ratio of methanol to isobutanol, and spun dry. The wafer was then placed in a dye bath containing 0.2 percent by weight of magenta dye MD-1 in water buffered to a pH of 10, left for 4 minutes, rinsed in water for 10 seconds, spun dry, placed in a solution of 4 percent by weight nickel acetate in a 1:1 volume ratio of methanol to water for 30 seconds, rinsed, and spun dry. The resulting magenta dyed layer had an optical density of 1.8. The dyed layer was then placed in a water bath for 10 minutes and then dried. There was no evidence of dye loss, and the optical density remained at 1.8.

EXAMPLE 14

Evaluation of dye imbibition of Compound 8 and the stability of the coating solution A solution containing Compound 8, 12.9 percent by weight solids in water and 8.4 percent by weight S2 based on total polymer was spin coated on 2 glass wafers at 2500 rpm, exposed for 10 seconds using a Canon ® PLA501F aligner, developed for 30 seconds in n-propanol, and spun dry. The original coating thickness was 0.82 μm, and the gelpoint exposure (as defined by W. H. Stockmeyer, *J. Chem. Phys.*, 12, 1944, p. 125) was 1.38 sec. One of the wafers was then placed in a dye bath containing 0.5 weight percent yellow dye YD-21 in water buffered to a pH of 10, left for 4 minutes, rinsed in water for 10 seconds, and spun dry. The resulting yellow dyed layer had an optical density of 2.2. The second glass wafer was baked at 200° C. for 12 min prior to being placed in the dye bath. There was no measurable absorbance in the coating due to the dye.

The coating solution was stored at room temperature in a brown bottle. After 63 days the solution was again coated, exposed, and developed as described above. The coating thickness was 0.85 μm, and the gelpoint exposure was 1.38 sec, which confirmed the stability of the coating solution.

EXAMPLE 15

Three Color Filter Element Mordant Formulation 1

| | |
|---|---|
| Compound 1 | 13.6 g |
| Surfactant A* | 0.2 g |
| Sensitizer S1 | 1.4 g |
| Deionized Water | 100.0 g |

*50% aqueous solution of nonylphenoxypolyglycerol

Mordant Formulation 2

| | |
|---|---|
| Compound 1 | 4.5 g |
| Surfactant A | 0.2 g |
| Sensitizer S1 | 1.1 g |
| Deionized Water | 100.0 g |

Barrier Formulation

| | |
|---|---|
| PEI-1 | 2.5 g |
| Dichloromethane | 97.5 g |

Yellow Dye Solution 1

| | |
|---|---|
| YD-1 | 0.4 g |
| Surfactant A | 0.2 g |
| pH 10 buffer* | 100.0 ml |

*Deionized water buffered to pH 10

Cyan Dye Solution 1

| | |
|---|---|
| CD-1 | 0.25 g |
| Surfactant A | 0.2 g |
| Methanol | 50 ml |
| pH 10 buffer | 50 ml |

Magenta Dye Solution 1

| | |
|---|---|
| MD-4 | 0.4 g |
| Surfactant A | 0.2 g |
| Methanol | 50 ml |
| pH 10 buffer | 50 ml |

A color filter array was fabricated on a 7.6 cm glass wafer according to the following procedure:

1. The wafer was spin coated at 2000 rpm with 10 ml of Mordant Formulation 1.

2. The wafer was baked at 120° C. for 10 minutes and then exposed for 20 seconds to UV light through a "yellow" mask allowing exposure in areas representing both the green and red set of filters.

3. The wafer was rinsed for 30 seconds with n-propanol developer to remove unexposed mordant.

4. The wafer was immersed in Yellow Dye Solution 1 for 4 minutes and then rinsed with deionized water and dried.

5. The wafer was spin coated at 2000 rpm for 30 seconds with 10 mL of the Barrier Formulation. Steps 1 through 5 were repeated with the following changes:

1. Mordant Formulation 1 was spin coated at 2500 rpm.

2. Exposure was for 20 seconds through a "cyan" mask, allowing exposure in areas representing both the blue and green filters.

3. The wafer was dyed in Cyan Dye Solution 1 for 2 minutes. Steps 1 through 4 were repeated with the following changes:

1. Mordant Formulation 2 was spin coated at 4000 rpm.

2. Exposure was through a "magenta" mask, allowing exposure in areas representing both the blue and red filters.

3. The wafer was dyed in Magenta Dye Solution 1 for 2 minutes.

The result was a high quality color filter array wherein (1) the cyan dyed filter layer overlapping the yellow dyed filter layer produced green filters that were 60% transmitting at 520 nm, (2) the magenta dyed filter layer overlapping the yellow dyed filter layer produced red filters that were 80% transmitting at 620 nm, and (3) the magenta dyed filter layer overlapping the cyan dyed filter layer produced blue filters that were 65% transmitting at 450 nm.

EXAMPLE 16

Image Sensor

A charge coupled device (CCD) semiconductor image sensor of the type shown in FIG. 7 was fabricated through the step of applying the planarizing layer 225. That is, all the structure shown in FIG. 7, was present, except the elements above the planarizing layer. A filter array was then formed on the surface the CCD by a sequence of steps similar to those described in Example 15, but with the dyes CD-2, MD-1, and YD-21 being imbibed in that order. The individual pixels of the sensor were less than $1 \times 10^{-8}$ m$^2$ in area. The sensor showed excellent chrominance discrimination in image recording.

The invention has been described in detail with particular reference to preferred embodiments thereof, but it will be understood that variations and modifications can be effected within the spirit and scope of the invention.

What is claimed is:

1. A color filter array comprised of interlaid sets of laterally displaced first, second, and third additive primary filters, characterized in that
    said sets of filters are comprised of two discrete bottom layers, one bottom layer containing a first subtractive primary dye forming a bottom layer of said first and second filters and a second bottom layer containing a second subtractive primary dye forming a bottom layer of said third filters and said sets of filters being formed of two discrete overlying layers, one overlying layer containing said second subtractive primary dye forming an overlying layer of said first filters and a second overlying layer containing a third subtractive primary dye forming an overlying layer of said second and third filters, at least one of said bottom and overlying layers being of controlled thickness and containing a single subtractive primary anionic dye and a cationic vinyl polymer mordant containing crosslinking repeating units of the formula:

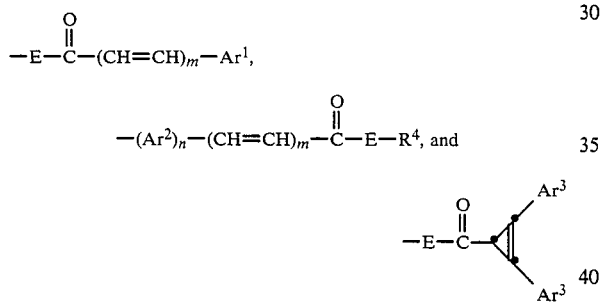

wherein, independently in each occurrence,

Ar is an aromatic linking group,
R is a methylene group,
$R^1$ is a lower alkyl group,
$R^2$ is a divalent linking group,
X is a [1,3-cyclobutylene] crosslinking group photogenerated by the addition reaction of two $X^1$ groups,
$X^1$ is chosen from the group consisting of $$-E-\overset{O}{\underset{\|}{C}}-(CH=CH)_m-Ar^1,$$

$$-(Ar^2)_n-(CH=CH)_m-\overset{O}{\underset{\|}{C}}-E-R^4, \text{ and}$$

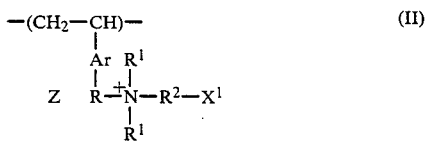

$Ar^1$ is an aromatic moiety;
$Ar^2$ is a divalent aromatic moiety;
E is an oxy or imino moiety;
m is 1 or 2;
n is 0 or 1;
$R^4$ is a terminal hydrocarbon group; and
Z represents one or more charge balancing counter ions.

2. A color filter array according to claim 1 further characterized in that said cationic vinyl polymer mordant additionally contains repeating units satisfying formula II:

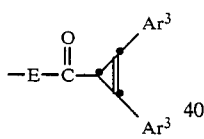 (II)

3. A color filter array according to claim 2 further characterized in that the repeating units I and II account for at least 20 percent of the total repeating units forming the cationic vinyl polymer mordant.

4. A color filter array according to claim 3 further characterized in that repeating units I are present in an amount sufficient to render the cationic vinyl polymer mordant insoluble in a developer.

5. A color filter array according to claim 2 further characterized in that up to 80 percent of the total repeating units forming the cationic vinyl polymer mordant satisfy formula:

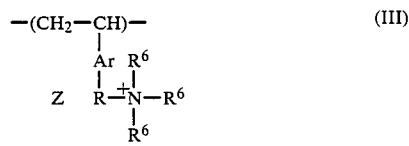 (III)

wherein

Ar is an aromatic linking group containing from 6 to 10 carbon atoms,
R is a methylene group,
$R^6$ is independently in each occurrence a hydrocarbon group or an oxy substituted hydrocarbon group containing from 1 to 16 carbon atoms, provided that in at least two occurrences $R^6$ contains from 1 to 3 carbon atoms, and
Z is a charge balancing counter ion.

6. A color filter array according to claim 1 further characterized in that said overlying layer containing said second additive primary dye is an integral lateral extension of said bottom layer containing said second additive primary dye.

7. A light sensing semiconductor device including an array of light sensing pixels each less than $1 \times 10^{-8} \, m^2$ in area comprised of a semiconductive substrate including a light sensing portion in each pixel area and
a filter array according to claim 1 for directing light through said sets of filters to said pixels.

8. A sensing device according to claim 7 further characterized in that each pixel of said semiconductive device includes a photodiode.

9. A sensing device according to claim 7 further characterized in that a separate lens is provided overlying each filter within each pixel.

10. A device for displaying color images on a viewable surface comprised of a plurality of laterally displaced pixel areas, means for modulating within each pixel area the luminance of light transmitted to the viewable surface and
a filter array according to claim 1 for controlling within each pixel area the chrominance of light transmitted to the viewable surface.

11. A color filter array comprised of interlaid sets of laterally displaced filters comprised of a polymeric matrix capable of providing cationic mordanting sites and at least one mordanted anionic dye, characterized in that each of said sets of filters is comprised of a cationic vinyl polymer mordant containing repeating units satisfying formulae I, II, and III:

$$\begin{array}{c} \phantom{X}\overset{|}{\text{CH}_2}\phantom{XXX}\overset{R^1}{|}\phantom{XXX}\overset{R^1}{|}\phantom{XXX}\overset{|}{\text{CH}_2} \\ \text{CH}-\text{Ar}-\text{R}\overset{+}{-}\overset{|}{\text{N}}-\text{R}^2-\text{X}-\text{R}^2\overset{+}{-}\overset{|}{\text{N}}-\text{R}-\text{Ar}-\text{CH} \\ \phantom{X}\overset{|}{\phantom{C}}\phantom{XXXX}\overset{|}{R^1}\phantom{XXXXX}\overset{|}{R^1}\phantom{XXXX}\overset{|}{\phantom{C}} \end{array} \quad Z \quad \text{(I)}$$

$$\begin{array}{c} -(\text{CH}_2-\text{CH})- \\ | \\ \text{Ar} \quad R^1 \\ | \quad +| \\ Z \quad R-\text{N}-R^2-X^1 \\ | \\ R^1 \end{array} \quad \text{(II)}$$

$$\begin{array}{c} -(\text{CH}_2-\text{CH})- \\ | \\ \text{Ar} \quad R^6 \\ | \quad +| \\ Z \quad R-\text{N}-R^6 \\ | \\ R^6 \end{array} \quad \text{(III)}$$

wherein, independently in each occurrence,
Ar is an aromatic linking group,
R is a methylene group,
$R^1$ is a lower alkyl group,
$R^2$ is a divalent linking group,
$R^6$ is independently in each occurrence a hydrocarbon group or an oxy substituted hydrocarbon group containing from 1 to 16 carbon atoms, provided that in at least two occurrences $R^6$ contains from 1 to 3 carbon atoms,
X is a crosslinking group formed by the addition reaction of two $X^1$ groups,
$X^1$ is $$-\text{E}-\overset{\overset{\text{O}}{\|}}{\text{C}}-(\text{CH}=\text{CH})_m-\text{Ar}^1, \text{ or}$$

$$-(\text{Ar}^2)_n-(\text{CH}=\text{CH})_m-\overset{\overset{\text{O}}{\|}}{\text{C}}-\text{E}-\text{R}^4,$$

Z represents one or more charge balancing counter ion
$Ar^1$ is an aromatic moiety;
$Ar^2$ is a divalent aromatic moiety;
E is an oxy or imino moiety;
m is 1 or 2;
n is 0 or 1; and
$R^4$ is a terminal hydrocarbon group.

12. A color filter array according to claim 11 further characterized in that repeating units I account for from 1 to 5 percent of the total repeating units of the vinyl polymer mordant, repeating units I and II together account for 30 to 60 percent of the repeating units forming the vinyl polymer mordant, and repeating units III account for 40 to 70 percent of the repeating units forming the polymer.

13. A light sensing semiconductor device including an array of light sensing pixels each less than $1 \times 10^{-8}$ $m^2$ in area comprised of
a semiconductive substrate including a light sensing portion in each pixel area and
a filter array for directing light to said semiconductive substrate comprised of interlaid sets of laterally displaced first, second, and third additive primary filters, each filter overlying one pixel, characterized in that
said sets of filters are comprised of two discrete bottom layers, one bottom layer containing a first subtractive primary dye forming a bottom layer of said first and second filters and a second bottom layer containing a second subtractive primary dye forming a bottom layer of said third filters and
said filters are comprised of two discrete overlying layers, one overlying layer containing said second subtractive primary dye forming an overlying layer of said first filters and a second overlying layer containing a third subtractive primary dye forming an overlying layer of said second and third filters,
each of said bottom and overlying layers being of controlled thickness and containing
a single subtractive primary anionic dye and
a cationic vinyl polymer mordant containing crosslinking repeating units of the formula:

$$\begin{array}{c} \phantom{X}\overset{|}{\text{CH}_2}\phantom{XXX}\overset{R^1}{|}\phantom{XXX}\overset{R^1}{|}\phantom{XXX}\overset{|}{\text{CH}_2} \\ \text{CH}-\text{Ar}-\text{R}\overset{+}{-}\overset{|}{\text{N}}-\text{R}^2-\text{X}-\text{R}^2\overset{+}{-}\overset{|}{\text{N}}-\text{R}-\text{Ar}-\text{CH} \\ \phantom{X}\overset{|}{\phantom{C}}\phantom{XXXX}\overset{|}{R^1}\phantom{XXXXX}\overset{|}{R^1}\phantom{XXXX}\overset{|}{\phantom{C}} \end{array} \quad Z$$

wherein, independently in each occurrence,
Ar is an aromatic linking group,
R is a methylene group,
$R^1$ is a lower alkyl group,
$R^2$ is a divalent linking group,
X is a [1,3-cyclobutylene] crosslinking group photogenerated by the addition reaction of two $X^1$ groups,
$X^1$ is chosen from the group consisting of $$-\text{E}-\overset{\overset{\text{O}}{\|}}{\text{C}}-(\text{CH}=\text{CH})_m-\text{Ar}^1,$$

$$-(\text{Ar}^2)_n-(\text{CH}=\text{CH})_m-\overset{\overset{\text{O}}{\|}}{\text{C}}-\text{E}-\text{R}^4, \text{ and}$$

$$-\text{E}-\overset{\overset{\text{O}}{\|}}{\text{C}}\diagup^{\text{Ar}^3}_{\text{Ar}^3}$$

$Ar^1$ is an aromatic moiety;
$Ar^2$ is a divalent aromatic moiety;
E is an oxy or imino moiety;
m is 1 or 2;
n is 0 or 1;
$R^4$ is a terminal hydrocarbon group; and
Z represents one or more charge balancing counter ions.

14. A sensing device according to claim 13 further characterized in that said one filter layer is comprised of a cationic vinyl polymer mordant containing repeating units satisfying formulae I, II, and III:

$$\begin{array}{c} \phantom{X}\overset{|}{\text{CH}_2}\phantom{XXX}\overset{R^1}{|}\phantom{XXX}\overset{R^1}{|}\phantom{XXX}\overset{|}{\text{CH}_2} \\ \text{CH}-\text{Ar}-\text{R}\overset{+}{-}\overset{|}{\text{N}}-\text{R}^2-\text{X}-\text{R}^2\overset{+}{-}\overset{|}{\text{N}}-\text{R}-\text{Ar}-\text{CH} \\ \phantom{X}\overset{|}{\phantom{C}}\phantom{XXXX}\overset{|}{R^1}\phantom{XXXXX}\overset{|}{R^1}\phantom{XXXX}\overset{|}{\phantom{C}} \end{array} \quad Z \quad \text{(I)}$$

-continued $$-(CH_2-CH)- \quad (II)$$
$$\begin{array}{c} | \\ Ar \quad R^1 \\ | \quad +| \\ Z \quad R-N-R^2-X^1 \\ | \\ R^1 \end{array}$$

$$-(CH_2-CH)- \quad (III)$$
$$\begin{array}{c} | \\ Ar \quad R^6 \\ | \quad +| \\ Z \quad R-N-R^6 \\ | \\ R^6 \end{array}$$

wherein, independently in each occurrence,
Ar is an aromatic linking group,
R is a methylene group,
$R^1$ is a lower alkyl group,
$R^2$ is a divalent linking group,
$R^6$ is independently in each occurrence a hydrocarbon group or an oxy substituted hydrocarbon group containing from 1 to 16 carbon atoms, provided that in at least two occurrences $R^6$ contains from 1 to 3 carbon atoms,
X is a crosslinking group formed by the addition reaction of two $X^1$ groups,
$X^1$ is $$-E-\overset{O}{\underset{\|}{C}}-(CH=CH)_m-Ar^1, \text{ or}$$

$$-(Ar^2)_n-(CH=CH)_m-\overset{O}{\underset{\|}{C}}-E-R^4,$$

Z represents one or more charge balancing counter ion $Ar^1$ is an aromatic moiety;
$Ar^2$ is a divalent aromatic moiety;
E is an oxy or imino moiety;
m is 1 or 2;
n is 0 or 1; and
$R^4$ is a terminal hydrocarbon group.

15. A device for displaying color images on a viewable surface comprised of a plurality of laterally displaced pixel areas,
means for modulating within each pixel area the luminance of light transmitted to the viewable surface and
a filter array for controlling within each pixel area the chrominance of light transmitted to the viewable surface comprised of interlaid sets of laterally displaced first, second, and third additive primary filters,
characterized in that
said sets of filters are comprised of two discrete bottom layers, one bottom layer containing a first subtractive primary dye forming a bottom layer of said first and second filters and a second bottom layer containing a second subtractive primary dye forming a bottom layer of said third filters and
said sets of filters are comprised of two discrete overlying layers, one overlying layer containing said second subtractive primary dye forming an overlying layer of said first filter and a second overlying layer containing a third subtractive primary dye forming an overlying layer of said second and third filters,
each of said bottom and overlying layers being of controlled thickness and containing
a single subtractive primary anionic dye and
a cationic vinyl polymer mordant containing crosslinking repeating units of the formula:

$$\begin{array}{c} | \qquad\qquad\qquad\qquad\qquad\qquad\qquad | \\ CH_2 \quad R^1 \qquad\qquad R^1 \quad CH_2 \\ | \quad\;\; +| \qquad\qquad\;\; +| \quad\;\; | \\ CH-Ar-R-N-R^2-X-R^2-N-R-Ar-CH \quad Z \\ | \qquad\qquad\qquad\qquad\qquad\qquad\qquad | \\ R^1 \qquad\qquad\qquad R^1 \end{array}$$

wherein, independently in each occurrence,
Ar is an aromatic linking group,
R is a methylene group,
$R^1$ is a lower alkyl group,
$R^2$ is a divalent linking group,
X is a [1,3-cyclobutylene] crosslinking group photogenerated by the addition reaction of two $X^1$ groups,
$X^1$ is chosen from the group consisting of $$-E-\overset{O}{\underset{\|}{C}}-(CH=CH)_m-Ar^1,$$

$$-(Ar^2)_n-(CH=CH)_m-\overset{O}{\underset{\|}{C}}-E-R^4, \text{ and}$$

$$-E-\overset{O}{\underset{\|}{C}} \diagdown_{Ar^3}^{Ar^3}$$

$Ar^1$ is an aromatic moiety;
$Ar^2$ is a divalent aromatic moiety;
E is an oxy or imino moiety;
m is 1 or 2;
n is 0 or 1;
$R^4$ is a terminal hydrocarbon group; and
Z represents one or more charge balancing counter ions.

16. A device for displaying color images according to claim 15 further characterized in that said one filter layer is comprised of a cationic vinyl polymer mordant containing repeating units satisfying formulae I, II, and III:

$$\begin{array}{c} | \qquad\qquad\qquad\qquad\qquad\qquad\qquad | \\ CH_2 \quad R^1 \qquad\qquad R^1 \quad CH_2 \\ | \quad\;\; +| \qquad\qquad\;\; +| \quad\;\; | \\ CH-Ar-R-N-R^2-X-R^2-N-R-Ar-CH \quad Z \\ | \qquad\qquad\qquad\qquad\qquad\qquad\qquad | \\ R^1 \qquad\qquad\qquad R^1 \end{array} \quad (I)$$

$$-(CH_2-CH)- \quad (II)$$
$$\begin{array}{c} | \\ Ar \quad R^1 \\ | \quad +| \\ Z \quad R-N-R^2-X^1 \\ | \\ R^1 \end{array}$$

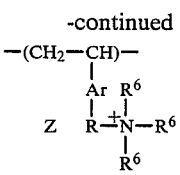 (III)

wherein, independently in each occurrence,
  Ar is an aromatic linking group,
  R is a methylene group,
  $R^1$ is a lower alkyl group,
  $R^2$ is a divalent linking group,
  $R^6$ is independently in each occurrence a hydrocarbon group or an oxy substituted hydrocarbon group containing from 1 to 16 carbon atoms, provided that in at least two occurrences $R^6$ contains from 1 to 3 carbon atoms, X is a crosslinking group formed by the addition reaction of two $X^1$ groups,
$X^1$ is

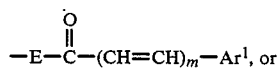

or

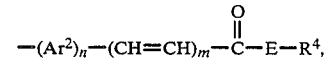

Z represents one or more charge balancing counter ion $Ar^1$ is an aromatic moiety;
$Ar^2$ is a divalent aromatic moiety;
E is an oxy or imino moiety;
m is 1 or 2;
n is 0 or 1; and
$R^4$ is a terminal hydrocarbon group.

* * * * *